United States Patent
Muraki

[11] Patent Number: 6,104,035
[45] Date of Patent: *Aug. 15, 2000

[54] ELECTRON-BEAM EXPOSURE APPARATUS AND METHOD

[75] Inventor: Masato Muraki, Inagi, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/084,917

[22] Filed: May 28, 1998

[30] Foreign Application Priority Data

Jun. 2, 1997 [JP] Japan ................................ 9-143834
Jul. 2, 1997 [JP] Japan ................................ 9-176924

[51] Int. Cl.$^7$ .................................................. H01J 37/302
[52] U.S. Cl. ................................. 250/492.22; 250/492.2
[58] Field of Search .............................. 250/492.2, 492.3, 250/398, 492.22

[56] References Cited

U.S. PATENT DOCUMENTS

| | | | |
|---|---|---|---|
| 4,130,761 | 12/1978 | Matsuda .................................. | 250/492 |
| 4,390,789 | 6/1983 | Smith et al. ........................... | 250/492.2 |
| 4,980,567 | 12/1990 | Yasuda et al. ......................... | 250/398 |
| 4,996,441 | 2/1991 | Lischke .................................. | 250/398 |
| 5,134,300 | 7/1992 | Kai et al. .............................. | 250/492.1 |
| 5,153,843 | 10/1992 | Pease .................................... | 250/396 R |
| 5,404,018 | 4/1995 | Yasuda et al. ......................... | 250/400 |
| 5,610,406 | 3/1997 | Kai et al. .............................. | 250/492.22 |
| 5,754,443 | 5/1998 | Manabe ................................. | 250/492.22 |
| 5,821,550 | 10/1998 | Yamashita ............................. | 250/492.22 |
| 5,834,783 | 11/1998 | Muraki et al. ......................... | 250/398 |

*Primary Examiner*—Bruce C. Anderson
*Attorney, Agent, or Firm*—Fitzpatrick, Cella, Harper & Scinto

[57] ABSTRACT

A multi electron-beam exposure apparatus which deflects a plurality of electron beams on an exposed surface, and upon each deflection, respectively controls irradiation of the respective electron beams. The apparatus writes a pattern by sequentially writing pattern parts of the pattern on subfields each composed of a plurality of elementary exposure fields, by simultaneously writing patterns on the respective elementary exposure fields. Pattern data of the pattern written on the exposed surface is divided in units of subfields, and as a control method for exposure of each subfield, a first control method to deflect the plurality of electron beams by a predetermined deflection width and set the electron beams, or a second control method to deflect the plurality of electron beams without setting the electron beams at positions where all the electron beams are cut off, is selected based on the divided pattern data for the subfield.

43 Claims, 24 Drawing Sheets

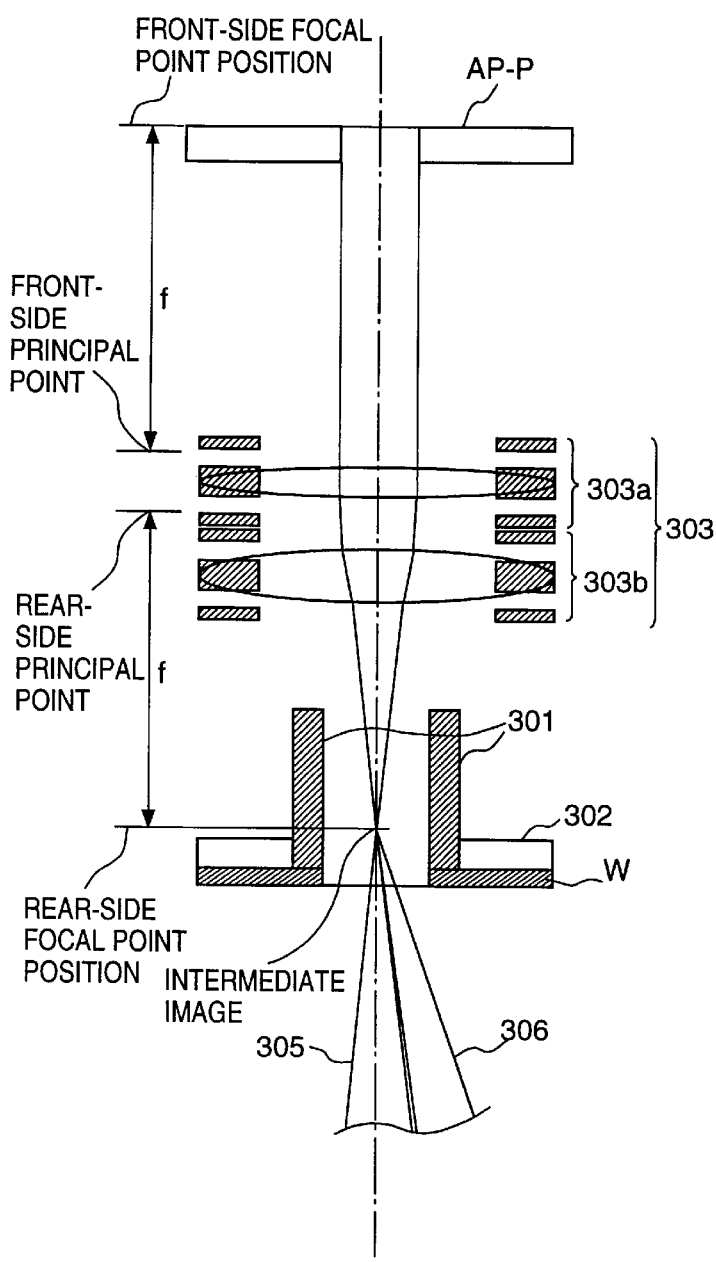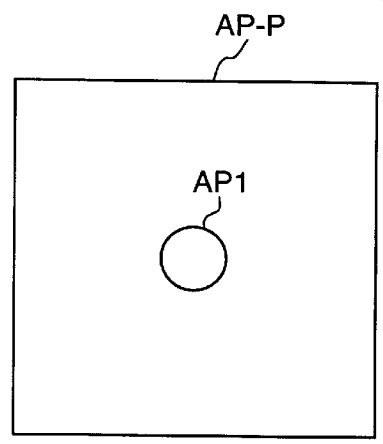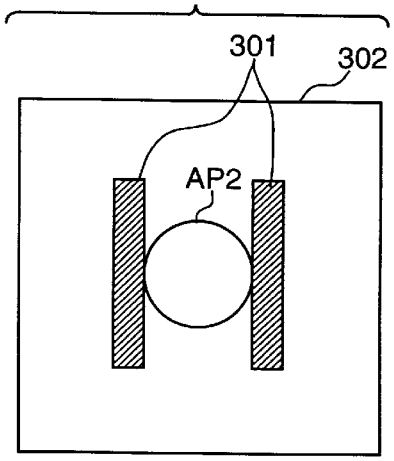

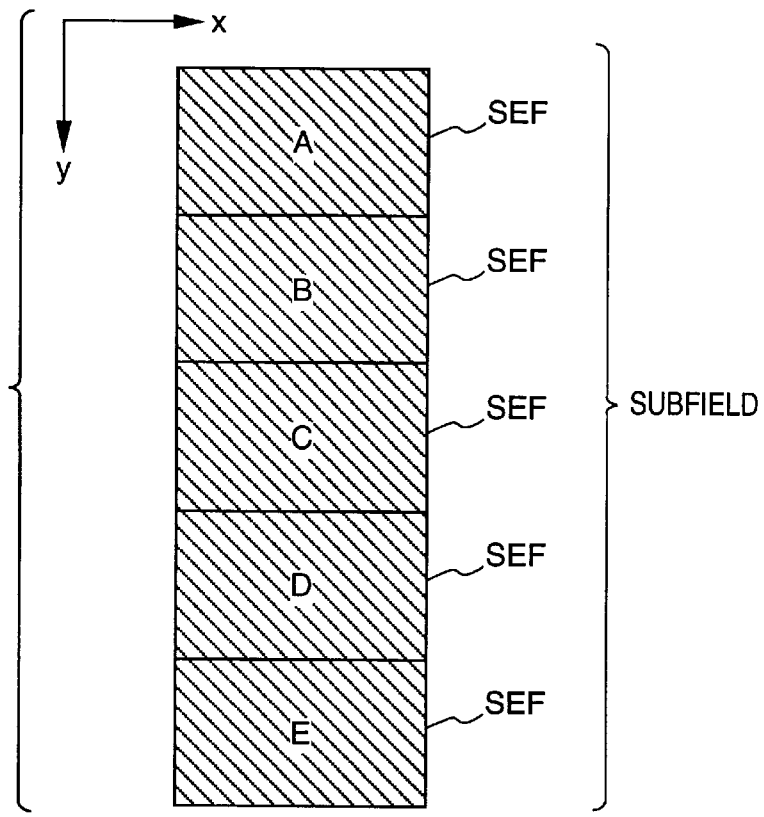
F I G. 7A
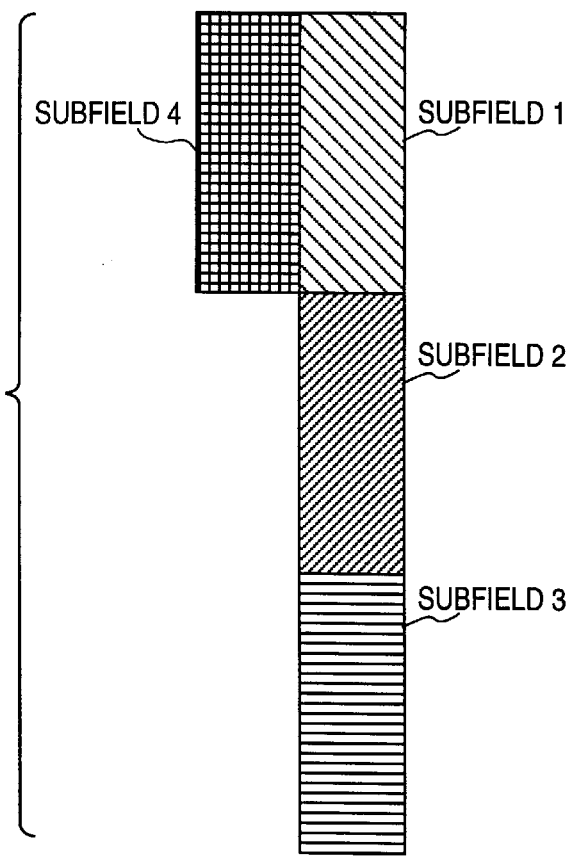
F I G. 7B

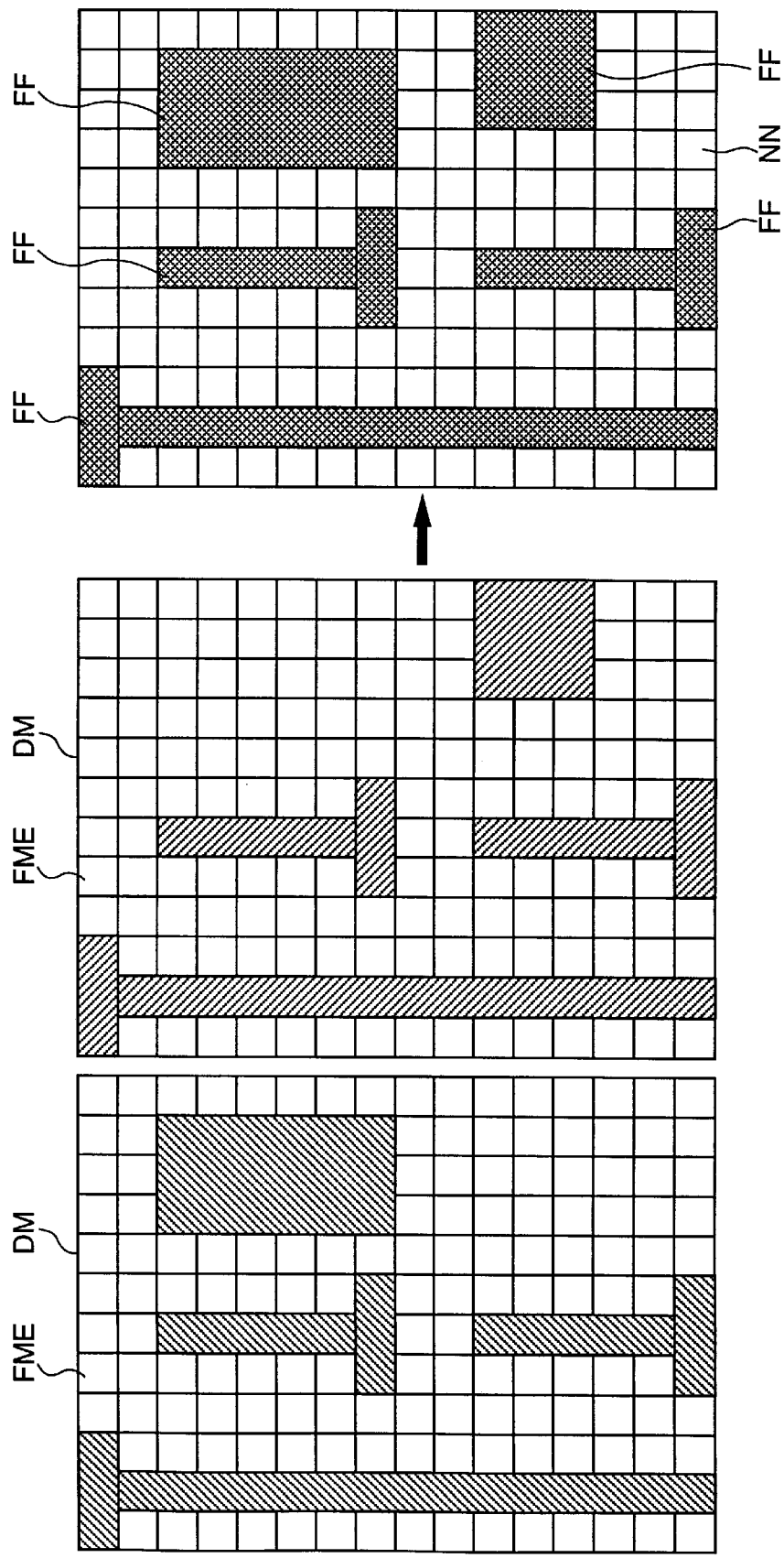

FIG. 11

| MINIMUM DEFLECTION WIDTH | BEAM DIAMETER |
|---|---|
| def | w |

| SUBFIELD No. | REFERENCE POSITION | CONTROL METHOD | DEFLECTION PERIOD | MATRIX No. | BLANKING CONTROL | | | |
|---|---|---|---|---|---|---|---|---|
| | | | | | A(1, 1) | A(1, 2) | A(1, 3) | ... E(3, 9) |
| 1 | x(1), y(1) | vector or raster | Td(1) | m1(1) | on or off | on or off | on or off | ... on or off |
| | | | | m1(2) | on or off | on or off | on or off | ... on or off |
| | | | | ... | ... | ... | ... | ... |
| | | | | m1(k) | on or off | on or off | on or off | ... on or off |
| 2 | x(2), y(2) | vector or raster | Td(2) | m2(1) | on or off | on or off | on or off | ... on or off |
| | | | | m2(2) | on or off | on or off | on or off | ... on or off |
| | | | | ... | ... | ... | ... | ... |
| | | | | m2(k) | on or off | on or off | on or off | ... on or off |
| ... | ... | ... | ... | ... | ... | ... | ... | ... |
| n | x(n), y(n) | vector or raster | Td(n) | mn(1) | on or off | on or off | on or off | ... on or off |
| | | | | mn(2) | on or off | on or off | on or off | ... on or off |
| | | | | ... | ... | ... | ... | ... |
| | | | | mn(k) | on or off | on or off | on or off | ... on or off |

FIG. 18A

[ CONTENTS OF EXPOSURE CONTROL DATA ]

| MINIMUM DEFLECTION WIDTH | BEAM DIAMETER |
|---|---|
| def | w |

| MAIN FIELD No. | STAGE SPEED | EXPOSURE CONTROL DATA FOR EACH SUBFIELD | | | |
|---|---|---|---|---|---|
| 1 | v(1) | SFD(1, 1) | SFD(1, 2) | ...... | SFD(1, 16) |
| 2 | v(2) | SFD(2, 1) | SFD(2, 2) | ...... | SFD(2, 16) |
| ... | | | | | ... |

FIG. 18B

[ CONTENTS OF EXPOSURE CONTROL DATA SFD FOR EACH SUBFIELD ]

| SUBFIELD No. | REFERENCE POSITION | CONTROL METHOD | DEFLECTION PERIOD | MATRIX No. | BLANKING CONTROL | | | | |
|---|---|---|---|---|---|---|---|---|---|
| | | | | | A(1, 1) | A(1, 2) | A(1, 3) | ... | E(3, 9) |
| n | x(n), y(n) | vector or raster | Td(n) | m(1) | on or off | on or off | on or off | ... | on or off |
| | | | | m(2) | on or off | on or off | on or off | ... | on or off |
| | | | | ... | ... | ... | ... | | ... |
| | | | | m(k) | on or off | on or off | on or off | ... | on or off |

SEMICONDUCTOR DEVICE MANUFACTURING FLOW

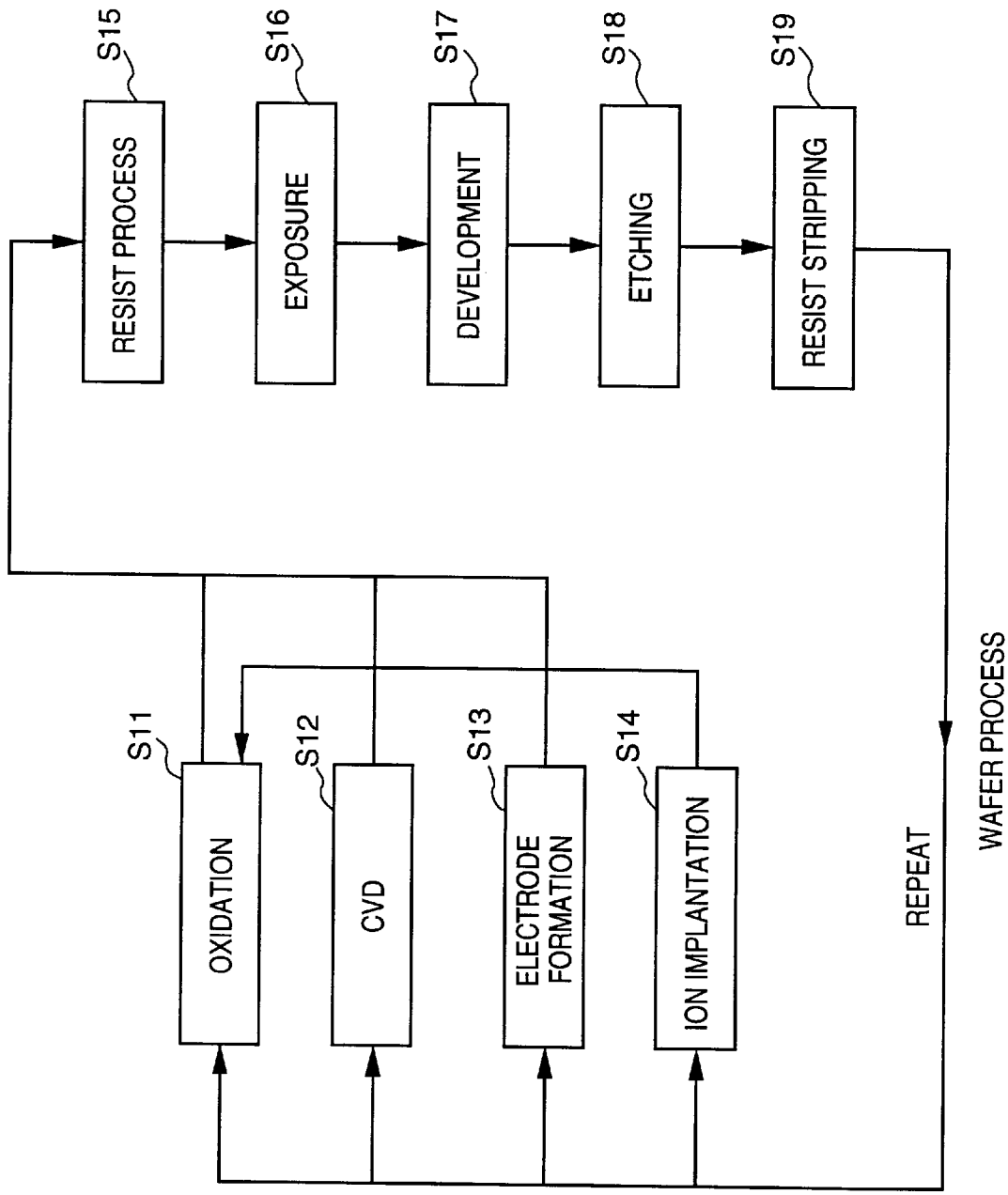

FIG. 24A
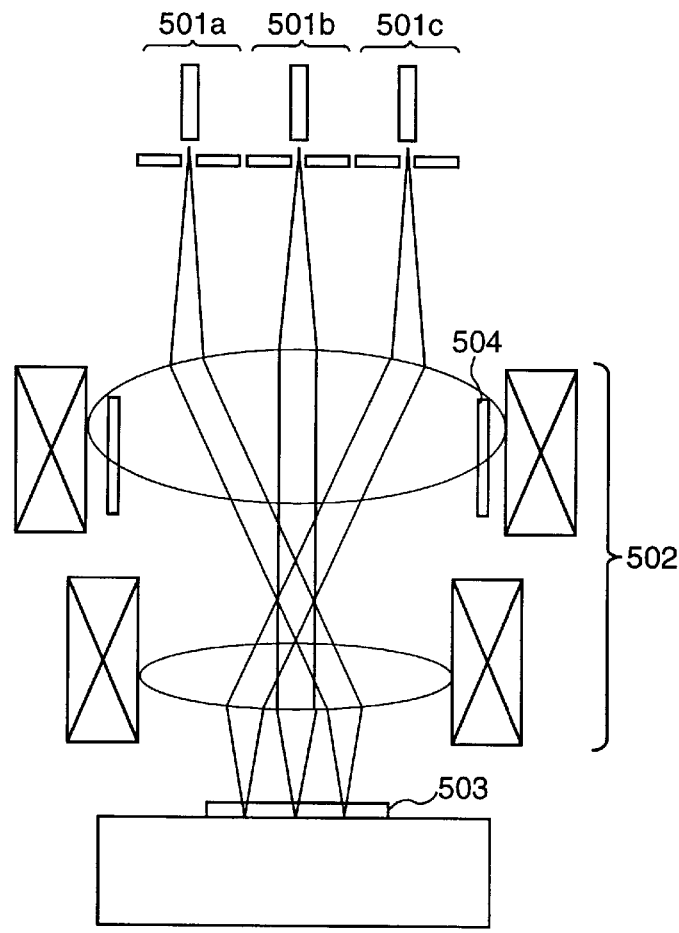
FIG. 24B    FIG. 24C    FIG. 24D
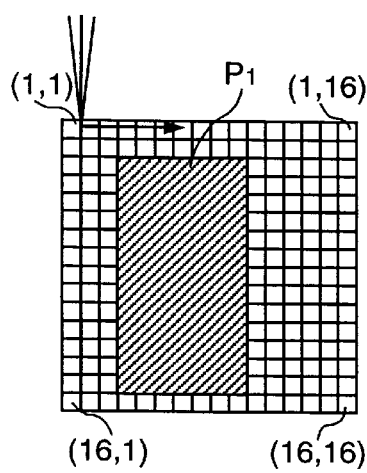
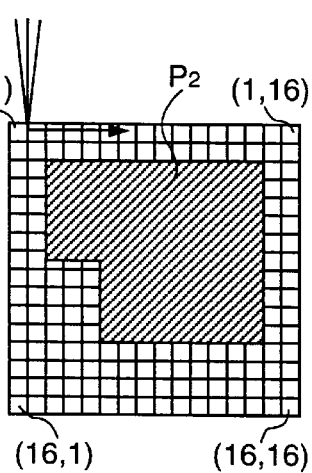
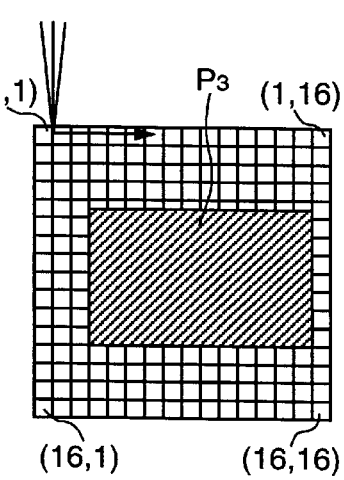

ELECTRON-BEAM EXPOSURE APPARATUS AND METHOD

BACKGROUND OF THE INVENTION

Field of the Invention

The present invention relates to an electron-beam exposure apparatus and, more particularly, to an electron-beam exposure apparatus for writing a pattern on a wafer or writing a pattern on a mask or reticle using a plurality of electron beams.

Known electron-beam exposure apparatuses are a point-beam type exposure apparatus which uses an electron beam having a spot cross section, a variable-rectangular beam type exposure apparatus which uses an electron beam having a variable-sized rectangular cross section, a stencil-mask type exposure apparatus which uses a stencil to shape the cross section of an electron beam into a desired shape, and the like, are known.

The point-beam type electron-beam exposure apparatus having a low throughput is only used for research and development. The variable-rectangular beam type electron-beam exposure apparatus has a throughput 10 or 100 times higher than that of the point-beam type apparatus, however, when it performs exposure with a fine and highly integrated pattern having a line width of about 0.1 $\mu$m, the throughput becomes lower. On the other hand, the stencil-mask type electron-beam exposure apparatus uses a stencil mask having a plurality of repetitive pattern transmitting holes at positions corresponding to variable rectangular apertures. The stencil-mask type electron-beam exposure apparatus is advantageous in use of the repetitive pattern, however, when forming a semiconductor circuit requiring a number of transfer patterns which cannot be formed in one stencil mask, it is necessary to form a plurality of stencil masks and use them one by one. This takes mask exchange time, thus greatly lowers the throughput.

As an apparatus to solve these problems, a multi electron-beam type exposure apparatus is known. This apparatus deflects a plurality of electron beams to scan a sample surface based on coordinate values on a circuit design, and respectively turns on/off the electron beams in accordance with a pattern to be written, to write the pattern on the sample surface. As the multi electronbeam type exposure apparatus writes an arbitrary pattern without a stencil mask, the throughput can be improved.

FIG. 24A shows the schematic construction of the multi electron-beam exposure apparatus. In FIG. 24A, reference numerals 501a to 501c denote electron guns which turn on/off irradiation of electron beams; 502, a reduction electron optical system which projects a plurality of electron beams from the electron guns 501a to 501c in a reduced scale on a wafer 503; and 504, a deflector which deflects the electron beams projected on the wafer 503.

The plurality of electron beams from the electron guns 501a to 501c are deflected by the same deflection amount by the deflector 504. The respective electron beams are sequentially set at respective matrix positions on the wafer, by the deflecting operation by the deflector 504, in accordance with the matrix positions arranged at matrix intervals determined based on a minimum deflection width of the deflector 504, from respective beam reference positions as the reference positions. Then, the respective electron beams write patterns on elementary exposure regions different from each other.

FIGS. 24B to 24D show pattern exposure states where the electron beams from the electron guns 501a to 501c write patterns in the same matrix order on the respective elementary exposure fields. The respective electron beams simultaneously move in the respective elementary exposure regions, while the electron beams are set at matrix positions, (1,1) to (1,16), (2,1) to (2,16), (3,1) to (3,16), and (16,1) to (16,16). At positions of the patterns to be written (P1 to P3 in FIGS. 24B to 24D), the electron beams are turned on, so that the patterns are formed.

In the above-described multi electron-beam exposure apparatus, as the respective electron beams simultaneously write different patterns, the minimum deflection width of the deflector 504 is set from the minimum line width in the patterns to be written. As the minimum line width becomes finer, the minimum deflection width becomes shorter, accordingly, the number of electron-beam setting positions for exposure increases. As a result, the throughput is lowered.

SUMMARY OF THE INVENTION

The present invention has been made in view of the above problems, and has its object to select an appropriate exposure control method for each subfield composed of a plurality of elementary exposure fields simultaneously exposed by a plurality of electron beams, and improve the exposure processing throughput.

Further, another object of the present invention is to select an appropriate exposure control method by calculating respective exposure processing periods in plural types of exposure control methods for each subfield, and selecting an exposure control method which requires the shortest exposure processing period.

Further, another object of the present invention is to select an exposure control method more easily and more quickly, by selecting an exposure control method for each subfield based on the number of settings in the subfield.

Further, another object of the present invention is to further improve the exposure processing throughput by controlling a stage moving speed of a stage carrying an exposed article, based on the exposure processing period determined by an exposure control method selected for each subfield.

Further, another object of the present invention is to determine an appropriate stage moving speed, in units of main fields each composed of a predetermined number of subfields arrayed in a direction orthogonal to a stage moving direction.

Further, another object of the present invention is to correct such that the difference between stage moving speeds for adjacent main fields to be equal to or less than a predetermined value, so as to determine an appropriate moving speed which does not cause heavy load on stage driving.

Further, another object of the present invention is to enable more stable stage driving while maintaining the throughput by determining a stage moving speed in units of frames each composed of a predetermined number of main fields arrayed in the stage moving direction.

An electron-beam exposure apparatus according to an aspect of the present invention to attain at least one of the above objects is an electron beam exposure apparatus which writes a drawing pattern based on pattern data by scanning an exposed surface by a plurality of electron beams, comprising: drawing means for writing a pattern on a subfield, composed of a plurality of elementary exposure fields on the exposed surface, by simultaneously writing patterns on the plurality of elementary exposure fields using the plurality of electron beams; division means for dividing the drawing pattern into pattern parts each having the same size as that of the subfield; selection means for selecting an exposure method for each subfield based on each pattern part for the subfield obtained by the division means; and control means for controlling the drawing means to write each pattern part on each subfield by using the exposure method selected by the selection means based on the pattern data.

Further, an electron-beam exposure apparatus according to another aspect of the present invention is an electron-beam exposure apparatus which performs exposure of an exposed surface of an exposed article on a stage by scanning the exposed surface by a plurality of electron beams, comprising: drawing means for writing a pattern on a subfield composed of a plurality of elementary exposure fields on the exposed surface, by simultaneously writing patterns on the plurality of elementary exposure fields using the plurality of electron beams; selection means for selecting an exposure method for each subfield based on each pattern part for the subfield; determination means for determining a moving speed of the stage based on an exposure processing period for each subfield in use of the exposure method selected by the selection means; and control means for controlling the drawing means to write each pattern part on each subfield by using the exposure method selected by the selection means, and controlling the stage to move at the moving speed determined by the determination means.

Further, according to another aspect of the present invention, an electron-beam exposure method realized in the electron-beam exposure apparatus, and a storage medium containing a control program for realizing the electron-beam exposure method by a computer are provided.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIGS. 3A to 3C are sectional views explaining an elementary electron optical system;

FIGS. 7A and 7B are schematic views explaining subfields;

FIGS. 10A to 10C are explanatory views showing patterns to be written by respective elementary electron optical systems and exposure regions in a matrix determined by a deflector;

FIG. 11 is a table explaining exposure control data according to the first embodiment;

FIGS. 18A and 18B are tables explaining the structures of exposure control data according to the second embodiment;

FIG. 23 is a flowchart explaining a wafer process;

FIG. 24A is a schematic view of the general multi electron-beam exposure apparatus; and FIGS. 24B to 24D are explanatory views showing exposure by electron beams in the multi electron-beam exposure apparatus in FIG. 24A.

DETAILED DESCRIPTION OF THE PREFERRED EMBODIMENT

Preferred embodiments of the present invention will now be described in detail in accordance with the accompanying drawings.

FIRST EMBODIMENT

<Constituents of Electron-Beam Exposure Apparatus>

Figure 1:
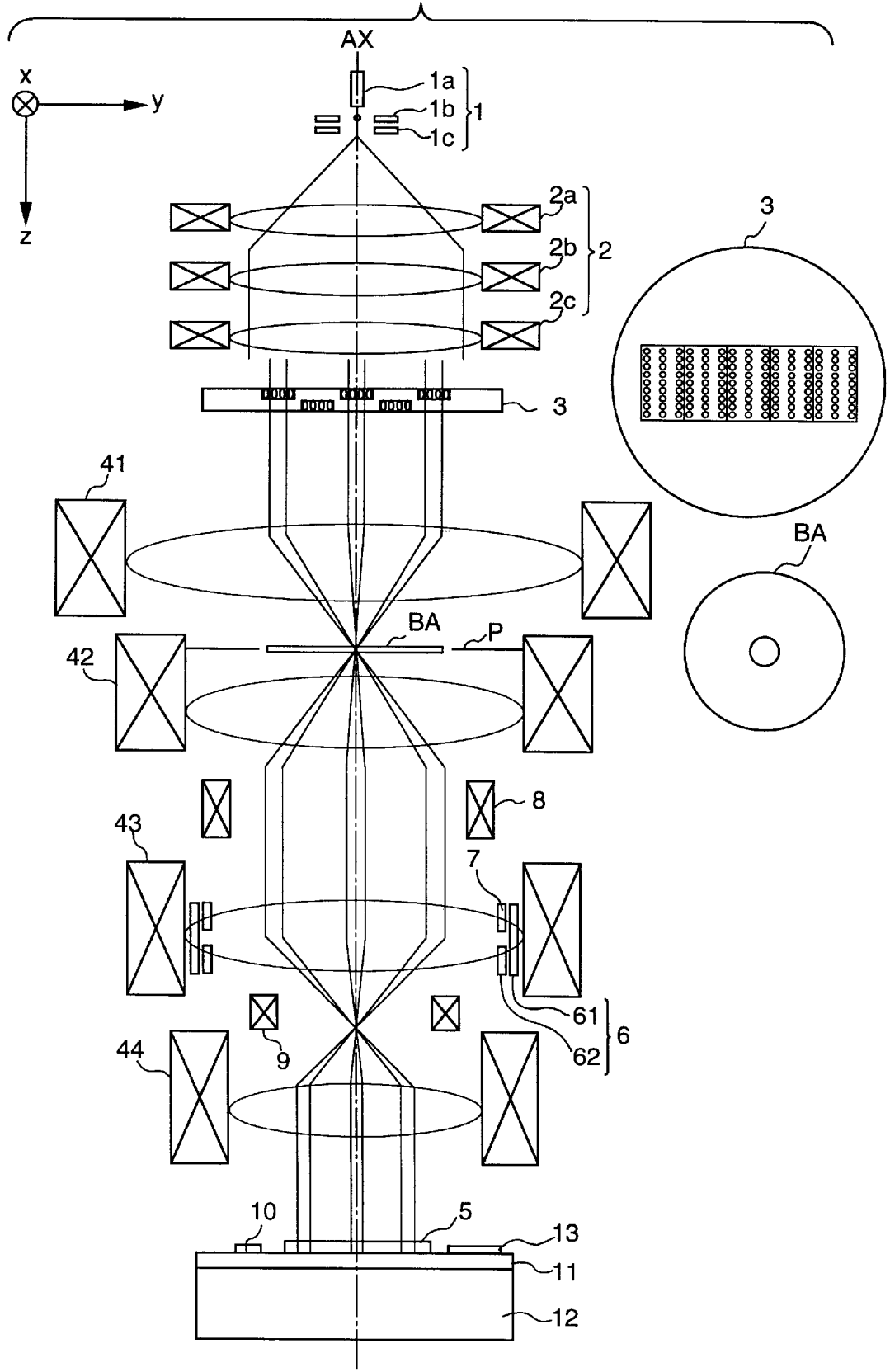
FIG. 1 is a schematic view of a principal part of an electron-beam exposure apparatus according to a first embodiment of the present invention.

FIG. 1 is a schematic view showing a principal part of an electron beam exposure apparatus according to the present invention.

In FIG. 1, reference numeral 1 denotes an electron gun having a cathode 1a, a grid 1b, and an anode 1c. Electrons emitted from the cathode 1a form a crossover image between the grid 1b and the anode 1c. Hereinafter, the crossover image will be referred to as an electron source.

The electrons emitted from the electron source are converted into substantially collimated electron beams by an illumination electron optical system 2 having a front-side focal point position located at the electron source position. The substantially collimated electron beams enter an elementary electron optical system array 3. The illumination electron optical system 2 has electron lenses 2a to 2c. The focal distance of the illumination electron optical system 2 can be changed while maintaining the focus point position on the electron-source side by adjusting electron optical powers (focal distances) of at least two of the electron lenses 2a to 2c. That is, the focal distance of the illumination electron optical system 2 can be changed while obtaining the collimated electron beams.

The substantially collimated electron beams from the illumination electron optical system 2 enter the elementary electron optical system array 3. The elementary electron optical system array 3 comprises a plurality of elementary electron optical systems, each consisting of an aperture, an electron optical system and a blanking electrode, two-dimensionally arranged in directions orthogonal to an optical axis AX. The elementary electron optical system array 3 will be explained in detail later.

The elementary electron optical system array 3 forms a plurality of electron-source intermediate images. The intermediate images are respectively projected in a reduced scale by a reduction electron optical system 4 to be described later, and form electron source images on a wafer 5. Assuming that the electron source has a size Ws, the illumination electron optical system 2 has a focal distance Fi, and the respective electron optical system of the elementary electron optical systems has a focal distance Fe, a size Wm of the electron-source intermediate image is expressed by:

$$Wm=Ws*Fe/Fi$$

Accordingly, when the focal distance of the illumination electron optical system 2 is changed, the sizes of the plural electron-source intermediate images are simultaneously changed, and as a result, the plural electron source images on the wafer 5 can be simultaneously changed. Further, the focal distance and the like of the respective elementary electron optical systems are set such that the sizes of the electron source images on the wafer 5 become substantially the same. Further, in the elementary electron optical system array 3, the positions in the optical axis direction of the intermediate images are different from each other in correspondence with the curvature of field of the reduction electron optical system 4. This corrects in advance aberration which occurs when the respective intermediate images are projected in the reduced scale on the wafer 5 by the reduction electron optical system 4.

The reduction electron optical system 4 comprises a symmetric magnetic doublet consisting of a first projection lens 41 (43) and a second projection lens 42 (44). Assuming that the first projection lens 41 (43) has a focal distance f1 and the second projection lens 42 (44) has a focal distance f2, the distance between these two lenses is f1+f2. The object point on the optical axis AX is located at the focal point position of the first projection lens 41 (43), and its image point is formed at the focal point of the second projection lens 42 (44). The image is reduced to −f2/f1. Further, as two lens magnetic fields are determined to interact in opposite directions, the Seidel aberrations and chromatic aberrations pertaining to rotation and magnification are theoretically canceled, except five aberrations, i.e., spherical aberration, isotropic astigmatism, isotropic coma aberration, aberration by curvature of image field, and on-axis chromatic aberration.

Numeral 6 denotes a deflector which deflects a plurality of electron beams from the elementary electron optical system array 3 to displace a plurality of electron source images by substantially equal displacement amounts in the X- and Y-directions on the wafer 5. The deflector 6 comprises a main deflector 61 used in case wide deflection width and long setting period (i.e., a period where deflection is suspended until setting is performed), and a sub deflector 62 used in case of narrow deflection width and short setting waiting period. The main deflector 61 is an electromagnetic type deflector, and the sub deflector 62 is an electrostatic deflector.

Numeral 7 denotes a dynamic focus coil which corrects shifts of the focus positions of the electron source images due to deflection aberration caused upon operation of the deflector 6; and 8, a dynamic stigmatic coil which corrects astigmatism of deflection aberration caused by deflection as in the dynamic focus coil 7.

Numeral 9 denotes a refocus coil which adjusts the focal point position of the reduction electron optical system 4 to correct blurring of electron beams due to the Coulomb effect caused by increase in the number of a plurality of electron beams to be irradiated on the wafer or the sum total of currents on the wafer.

Numeral 10 denotes a Faraday cup having two single knife edges respectively extending in the X- and Y-directions. The Faraday cup 10 detects the charge amount of electron source images formed by the electron beams from the elementary electron optical systems.

Numeral 11 denotes a θ-Z stage which carries a wafer and which is movable in the direction of the optical axis AX (Z-axis) and in a rotational direction about the Z-axis. A stage reference plate 13 and the Faraday cup 10 are fixed on the stage 11.

Numeral 12 denotes an X-Y stage which carries the θ-Z stage and which is movable in the X- and Y-directions orthogonal to the optical axis AX (Z-axis).

Figure 2:
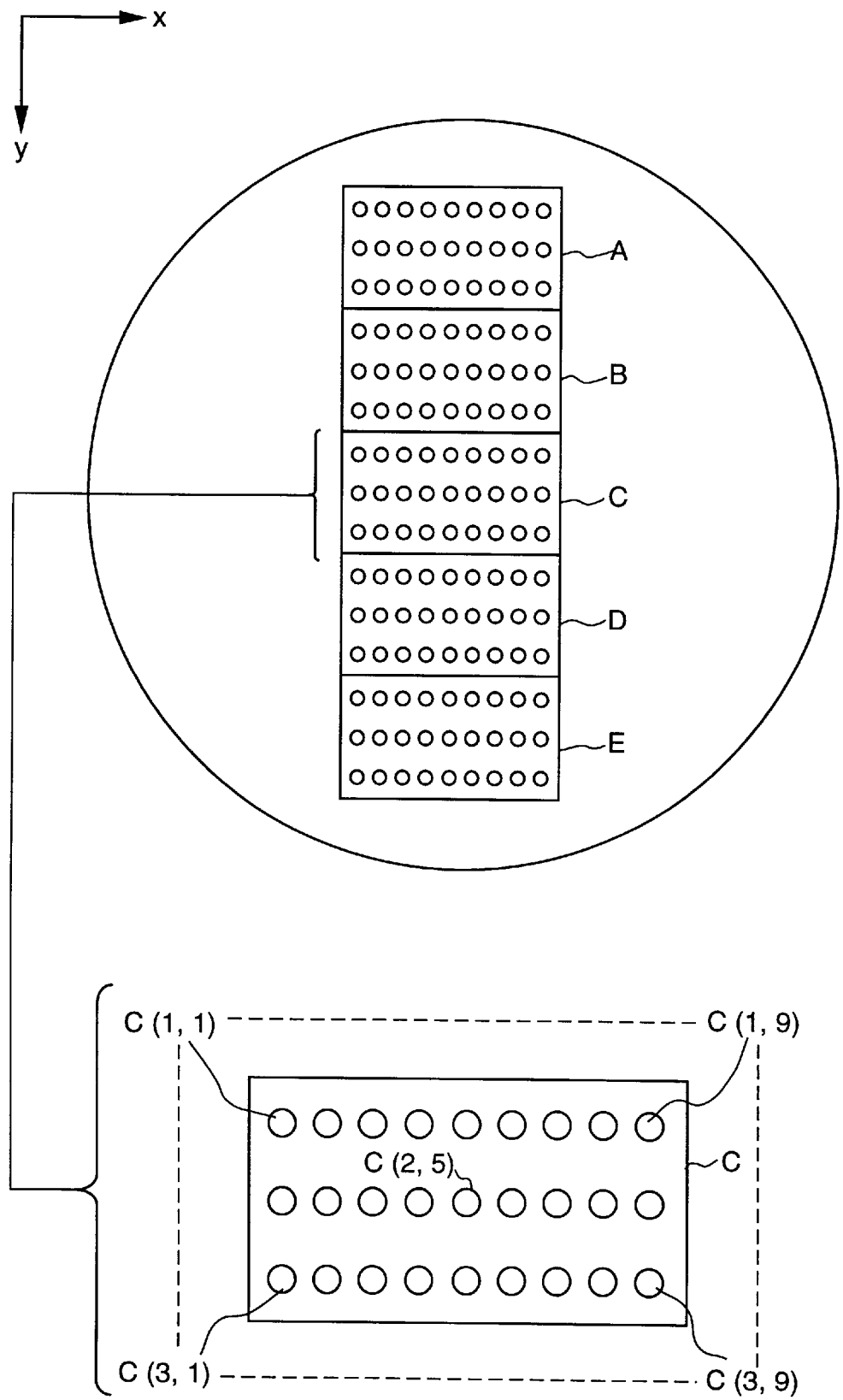
FIG. 2 is an explanatory view showing an elementary electron optical system array 3.

Next, the elementary electron optical system array 3 will be described with reference to FIG. 2.

The elementary electron optical system array 3 has a plurality of subarrays each including a plurality of elementary electron optical systems. In the present embodiment, the elementary electron optical system array 3 has five subarrays A to E. In each subarray, a plurality of elementary electron optical systems are two-dimensionally arranged. In the present embodiment, twenty-seven elementary electron optical systems C(1,1) to C(3,9) are formed in each subarray.

FIGS. 3A to 3C are sectional views explaining each elementary electron optical system.

In FIG. 3A, reference AP-P denotes a substrate which is irradiated with electron beams substantially collimated by the illumination electron optical system 2. The substrate AP-P has an aperture (AP1) to define the transmitted electron beam (See FIG. 3B). The substrate AP-P is common to other elementary electron optical systems. That is, the substrate AP-P has a plurality of apertures.

Numeral 301 denotes a blanking electrode comprising a pair of electrodes. The blanking electrode 301 has a deflection function. Numeral 302 denotes a substrate having an aperture (AP2) larger than the aperture AP1 (See FIG. 3C). The substrate 302 is common to other elementary electron optical systems. Further, the blanking electrode 301 and a wiring (W) to turn on/off the electrode are formed on the substrate 302. That is, the substrate 302 has a plurality of apertures and a plurality of blanking electrodes.

Numeral 303 denotes an electron optical system using two unipotential lenses 303a and 303b. Each unipotential lens has three aperture electrodes. The upper and lower electrodes have the same potential as an acceleration potential V0, and the potential of the intermediate electrode is constantly at another potential V1 or V2. Thus, each unipotential lens has a convergence function. The individual aperture electrodes are formed on a substrate via insulating material, and the substrate is common to other elementary electron optical systems. That is, the substrate has a plurality of electron optical systems 303.

Figure 4A:
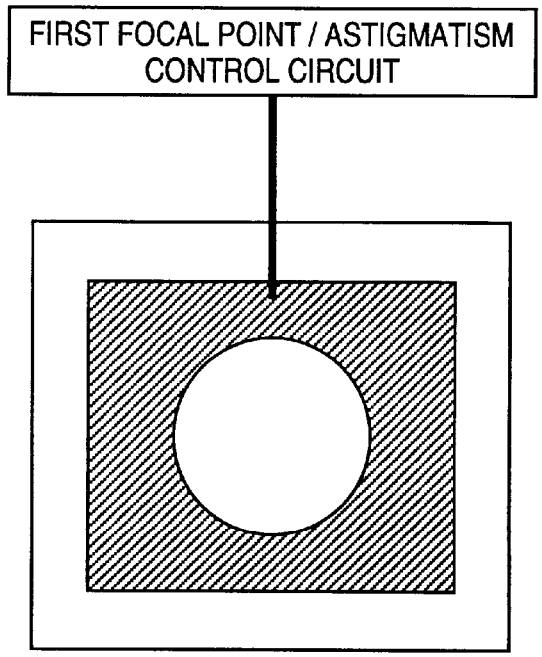
FIGS. 4A and 4B are schematic views explaining electrodes of the elementary electron optical system.

The upper, intermediate and lower electrodes of the unipotential lens 303a, and the upper and lower electrodes of the unipotential lens 303b have a shape as shown in FIG. 4A. The upper and lower electrodes of the unipotential lenses 303a and 303b are set to a common potential in all the elementary electron optical systems by a first focal point/astigmatism control circuit to be described later.

As the potential of the intermediate electrode of the unipotential lens 303a can be set by the first focal point/astigmatism control circuit for each elementary electron optical system, the focal distance of the unipotential lens 303a can be set for each elementary electron optical system.

Figure 4B:
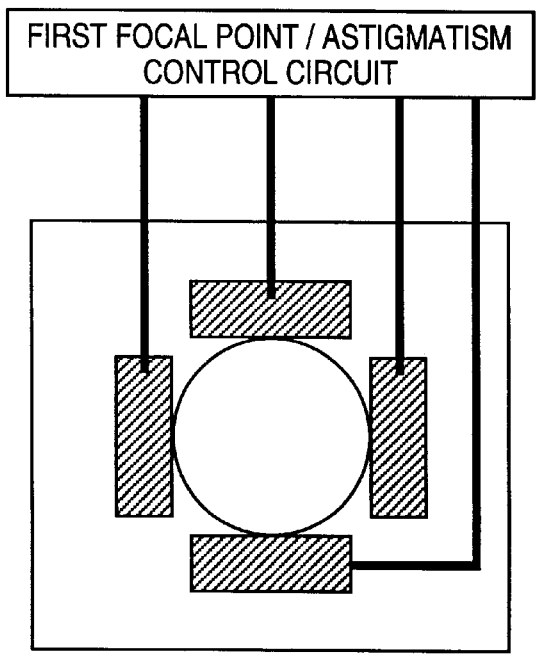

Further, the intermediate electrode of the unipotential lens 303b comprises four electrodes as shown in FIG. 4B. The potentials of these electrodes can be individually set, and can be set for each elementary electron optical system, by the focal point/astigmatism control circuit. Accordingly, it can be arranged such that the focal distance of the unipotential lens 303b changes in different cross sections perpendicular to its optical axis, and the focal distance can be set for each elementary electron optical system.

That is, the electron optical characteristics (intermediate image forming position and astigmatism) of the elementary electron optical system can be controlled by respectively controlling the potentials of the intermediate electrodes of the electron optical systems 303. To control the intermediate image forming position, as the size of the intermediate image is determined by the ratio between the focal distance of the illumination electron optical system 2 and the electron optical system 303 as described above, the intermediate image forming position is moved by setting a constant focal distance of the electron optical system 303 and moving its principal point position. By this control, the intermediate images formed by all the elementary electron optical systems have substantially the same size and the images are located at different positions in the optical axis direction.

Each of the electron beams substantially collimated by the illumination electron optical system 2 forms an electron-source intermediate image via the aperture (AP1) and the electron optical system 303. Note that the aperture (AP1) is located at or in the vicinity of the front-side focal point position of the corresponding electron optical system 303, and the blanking electrode 301 is located at or in the vicinity of the intermediate image forming position (rear-side focal point position) of the electron optical system 303. In this arrangement, if no electric field is applied between the electrodes of the blanking electrode 301, the electron beam is not deflected as an electron beam 305 in FIG. 3. On the other hand, if an electric field is applied between the electrodes of the blanking electrode 301, the electron beam is deflected, as an electron beam 306 in FIG. 3. Since the electron beams 305 and 306 have different angle distributions on the object plane of the reduction electron optical system 4, the electron beams 305 and 306 are incident on different regions at the pupil position (on a plane P in FIG. 1) of the reduction electron optical system 4. Accordingly, a blanking aperture BA that transmits only the electron beam 305 is formed at the pupil position (on the plane P in FIG. 1) of the reduction electron optical system.

Further, to correct the curvature of image field and astigmatism caused when the intermediate images formed by the respective electron optical systems are projected in a reduced scale by the reduction electron optical system 4 on the surface to be exposed, the potentials of the two intermediate electrodes of the electron optical systems 303, are respectively set such that the electron optical systems have different electron optical characteristics (intermediate image forming positions and astigmatism). However, in the present embodiment, in order to reduce the number of wirings between the intermediate electrodes and the first focal point/astigmatism control circuit, the elementary electron optical systems in a single subarray have the same electron optical characteristics, and the electron optical characteristics (intermediate image forming positions and astigmatism) of the elementary electron optical systems are controlled by each subarray.

Further, in order to correct distortion aberration caused when a plurality of intermediate images are projected in a reduced scale by the reduction electron optical system 4 on the surface to be exposed, the distortion characteristic of the reduction electron optical system 4 is detected in advance, and the positions of the elementary electron optical systems in the direction orthogonal to the optical axis of the reduction electron optical system 4 are set based on the detected characteristic.

Figure 5:
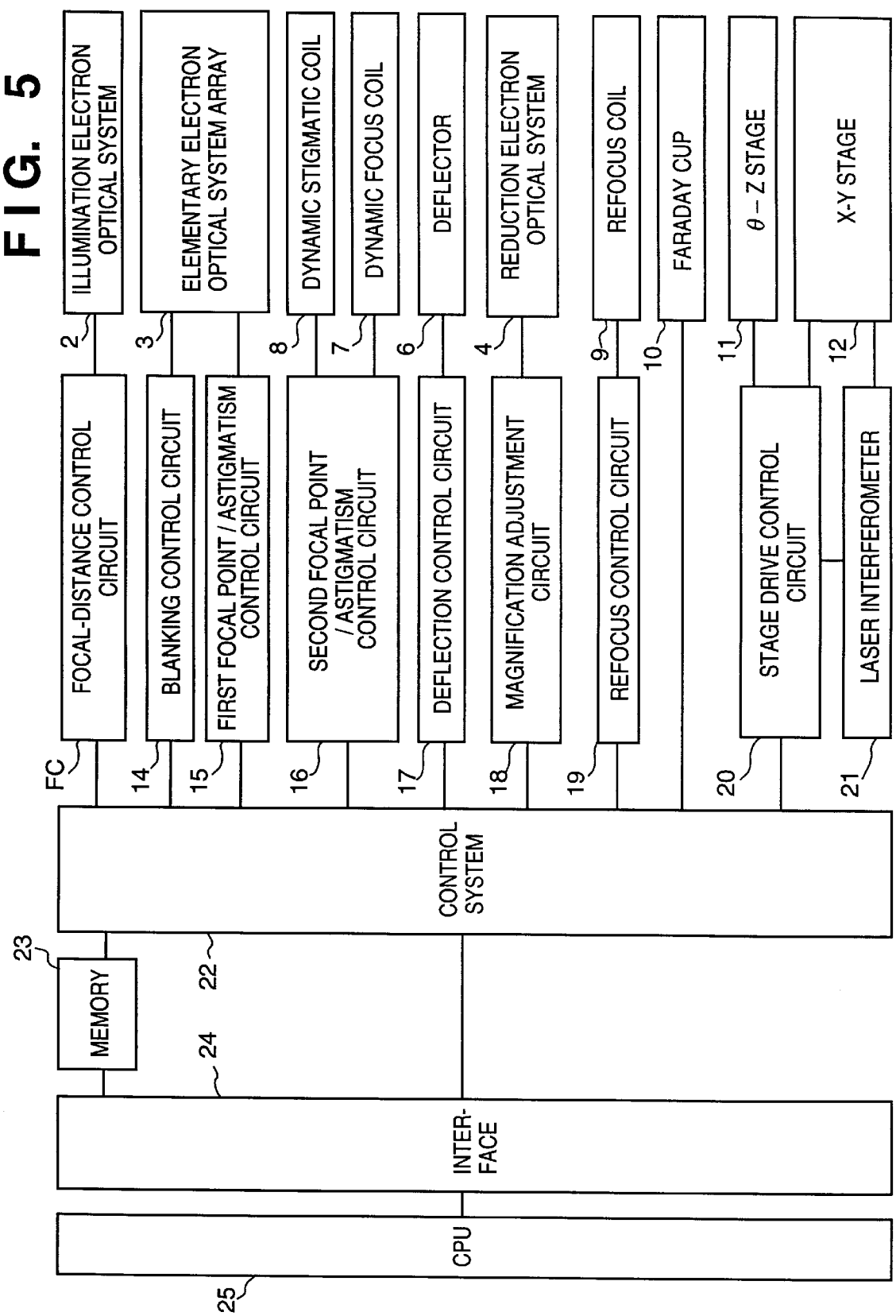
FIG. 5 is a block diagram showing the system arrangement of the electron-beam exposure apparatus according to the first embodiment of the present invention.

FIG. 5 shows the system arrangement of the present embodiment.

A focal-distance control circuit FC controls the focal distance of the illumination electron optical system 2 while maintaining the focal point position of the illumination electron optical system 2 on the electron-source side, by controlling the electron optical powers (focal distances) of at least two of the electron lenses 2a to 2c of the illumination electron optical system 2.

A blanking control circuit 14 respectively on/off-controls the blanking electrodes of the elementary electron optical systems in the elementary electron optical system array 3. The first focal point/astigmatism control circuit 15 respectively controls the electron optical characteristics (intermediate image forming positions and astigmatism) of the elementary electron optical systems in the elementary electron optical system array 3.

A second focal point/astigmatism control circuit 16 controls the focal point position and astigmatism of the reduction electron optical system 4 by controlling the dynamic stigmatic coil 8 and dynamic focus coil 7. A deflection control circuit 17 controls the deflector 6. A magnification adjustment circuit 18 adjusts the magnification of the reduction electron optical system 4. A refocus control circuit 19 controls current to be supplied to the refocus coil 9 to adjust the focal point position of the reduction electron optical system 4.

A stage drive control circuit 20 drives the θ-Z stage, and also drive-controls the X-Y stage 12 in cooperation with a laser interferometer 21 which detects the position of the X-Y stage 12.

A control system 22 controls the plurality of control circuits described above, a reflection electron detector and the Faraday cup 10 in synchronism to attain exposure and alignment based on exposure control data from a memory 23. The control system 22 is controlled by a CPU 25 for controlling the overall electron-beam exposure apparatus via an interface 24. Note that the memory 23 has a RAM for storing the exposure control data to be described in detail later and a ROM for storing control programs for the control system 22 to perform processings in FIGS. 9 and 12 to be described later.

<Exposure Operation>

Next, the exposure operation of the electron-beam exposure apparatus of this embodiment will be described.

Figure 6A:
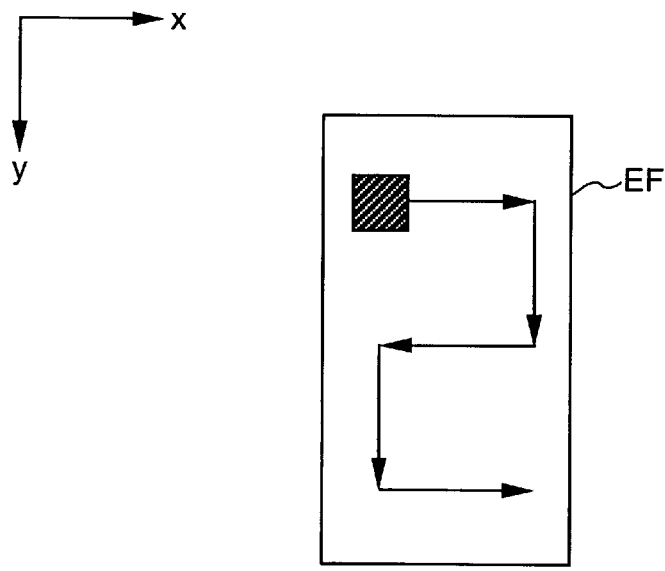
FIGS. 6A and 6B are schematic views explaining an elementary exposure field (EF) and a subarray exposure field (SEF)

The control system 22 instructs the deflection control circuit 17 to deflect a plurality of electron beams from the elementary electron optical system array 3 by the sub deflector 62 of the deflector 6, based on the exposure control data from the memory 23. Further, the control system 22 instructs the blanking control circuit 14 to turn on/off the blanking electrodes of the respective elementary electron optical systems in correspondence with a pattern formed on the wafer 5. At this time, the X-Y stage 12 is continuously moving in the X-direction. As shown in FIG. 6A, each of the electron beams from the elementary electron optical systems scans an elementary exposure field on the wafer 5 from a start point represented as a solid black rectangular portion in FIG. 6A.

Note that the elementary exposure field (EF) includes a matrix as shown in FIG. 10A to be described later. The electron beam is deflected by the sub deflector 62 of the deflector 6 to be set on the respective matrix positions as shown in FIG. 10A, and turned on/off (i.e., the blanking electrode 301 is turned on/off) in accordance with the exposure pattern.

Figure 6B:
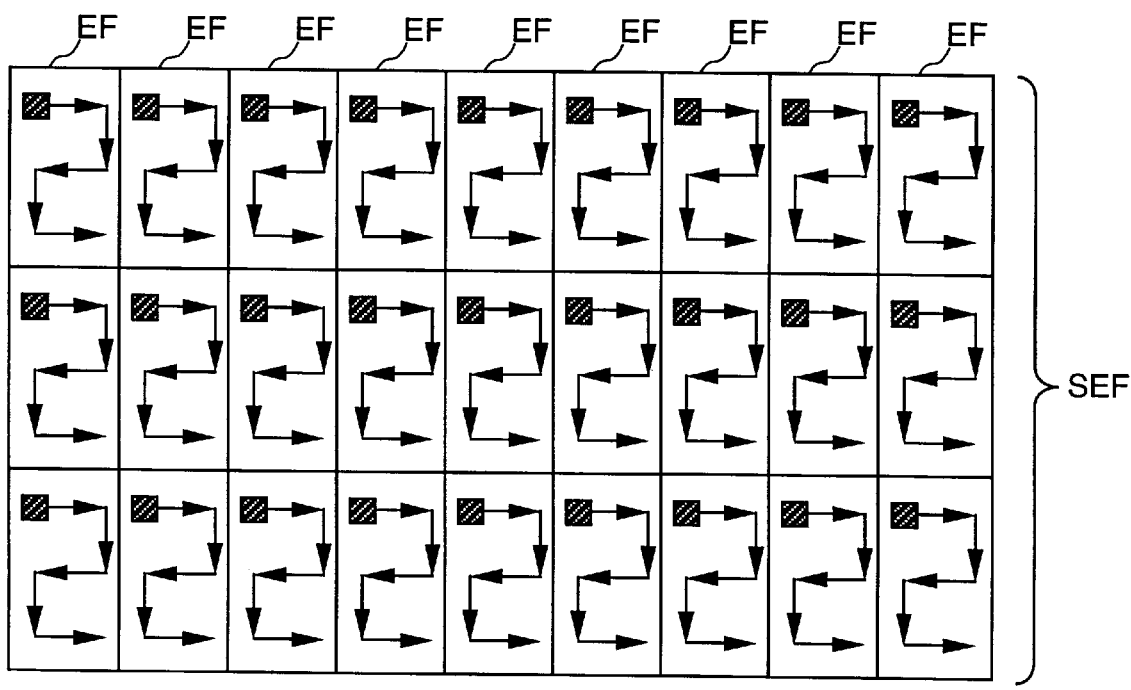

Further, as shown in FIG. 6B, elementary exposure fields EFs of the plurality of elementary electron optical systems in a subarray are two-dimensionally arranged adjacently to each other, and as a result, on the wafer 5, a subarray exposure field (SEF) composed of a plurality of elementary exposure fields EFs is exposed. At the same time, as shown in FIG. 7A, a subfield composed of the subarray exposure fields SEFs A to E is exposed on the wafer 5. In other words, the subfield composed of the two-dimensionally arranged elementary exposure fields EFs is exposed.

Figure 8:
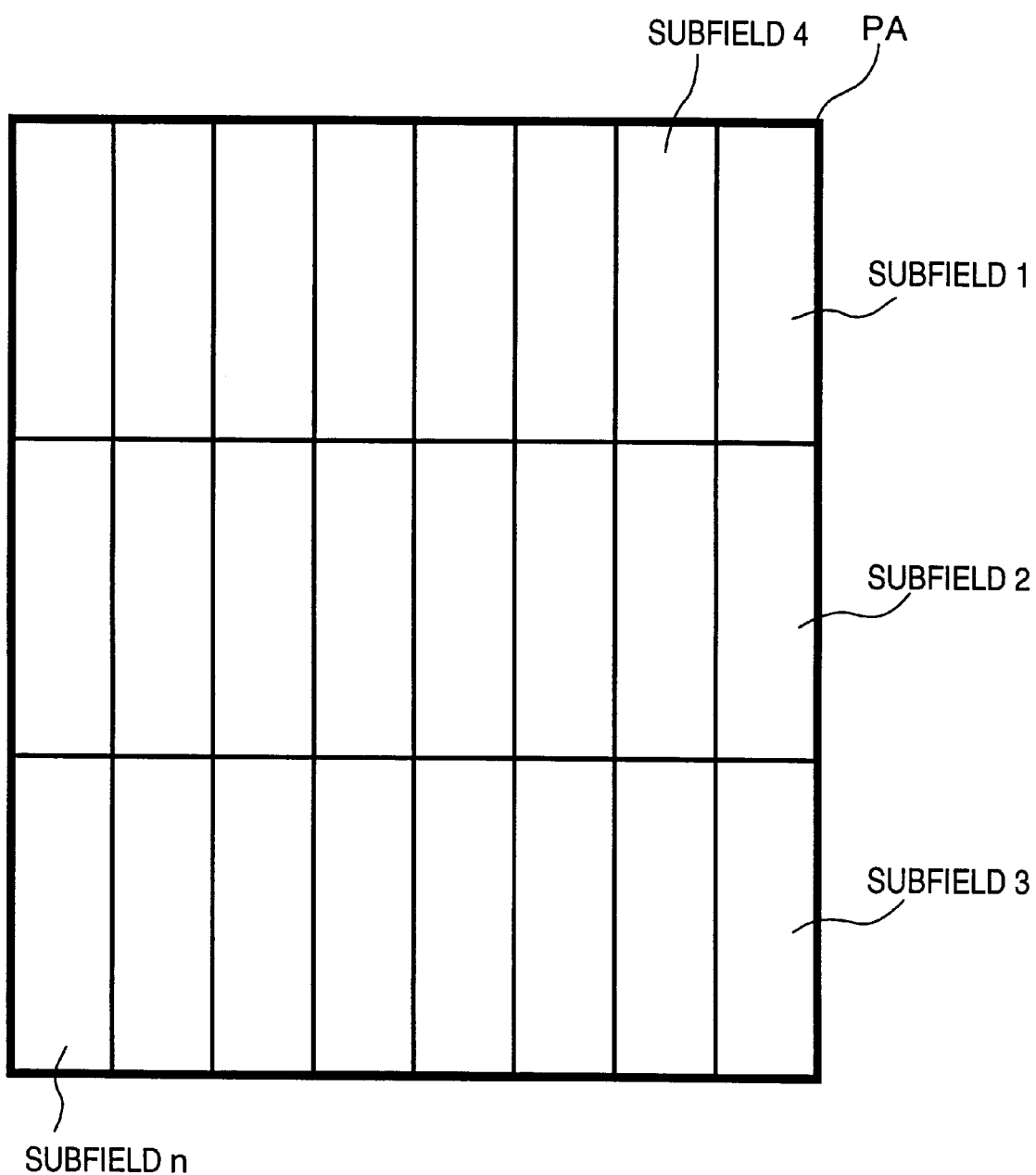
FIG. 8 is a schematic view explaining the relation between the subfields and a pattern area.

The control system 22 performs exposure of a subfield 1 as shown in FIG. 7B. Thereafter, to perform exposure of a subfield 2, the control system 22 outputs a command signal to the deflection control circuit 17 to deflect the plurality of electron beams from the elementary electron optical system array 3 by the main deflector 61 of the deflector 6 to reference positions of the subfield 2. Then, the control system 22 instructs the deflection control circuit 17 to deflect the plurality of electron beams from the elementary electron optical system array 3 by the sub deflector 62 of the deflector 6, and instructs the blanking control circuit 14 to turn on/off the blanking electrodes 301 of the respective elementary electron optical systems in correspondence with the pattern to be formed on the wafer 5, thus performing exposure of the subfield 2. Then, as shown in FIG. 7B, exposure is made in the subsequent subfields 3, 4, . . . , sequentially, to form patterns on the wafer 5. That is, as shown in FIG. 8, assuming that patterns based on pattern data are written in a pattern area PA on the wafer 5, the electron-beam exposure apparatus of the present embodiment sequentially performs exposure in units of subfields in the pattern area PA.

In the present embodiment, upon exposure of one subfield, a vector-scan control method in multi electron-beam exposure (hereinafter referred to as "vector-scan control method") or a raster-scan control method in multi electron-beam exposure (hereinafter referred to as "raster-scan control method") is selected. In the vector-scan control method, at deflection positions where all the electron beams are cut off, the plurality of electron beams are not set but merely deflected. In the raster-scan control method, the plurality of electron beams are deflected by a predetermined deflection width (minimum deflection width) and sequentially set at the respective deflection positions. The deflection period of the sub deflector 62 for exposure of the subfield is constant, and it is represented as follows. That is, assuming that the respective electron beams are set at the deflection positions for a setting period (so-called exposure period) Ts (sec), and the maximum setting waiting period (a setting waiting period is a period from a point where the electron beam is deflected from a deflection position to a point where the beam is set at a desired deflection position) in the subfield is denoted by To (sec), a deflection period Td (sec) of the sub deflector 62 is:

Td=Ts+To

Generally, the setting waiting period To increases as the deflection width increases. In the vector-scan control method, the deflection width between a setting position to another setting position may be wider in comparison with the raster-scan control method. Therefore, the setting waiting period in the vector-scan control method may be longer than that in the raster-scan control method. As a result, the deflection period Td in the vector-scan control method is longer than that in the raster-scan control method. Contrary, the number of setting positions to deflect the electron beams in a subfield in the vector-scan control method is smaller than that in the raster-scan control method. Accordingly, an appropriate control method for exposure of a subfield for a short period differs depending on the deflection period Td and the number of setting positions. Further, the deflection period and the number of setting positions differ depending on a pattern to be written. In the present embodiment, a control method is selected based on a pattern to be written (pattern data), and a subfield is exposed in accordance with the selected control method.

(Exposure Control Data Generation Processing)

Next, the method for generating exposure control data of the electron-beam exposure apparatus of the present embodiment will be described.

Figure 9:
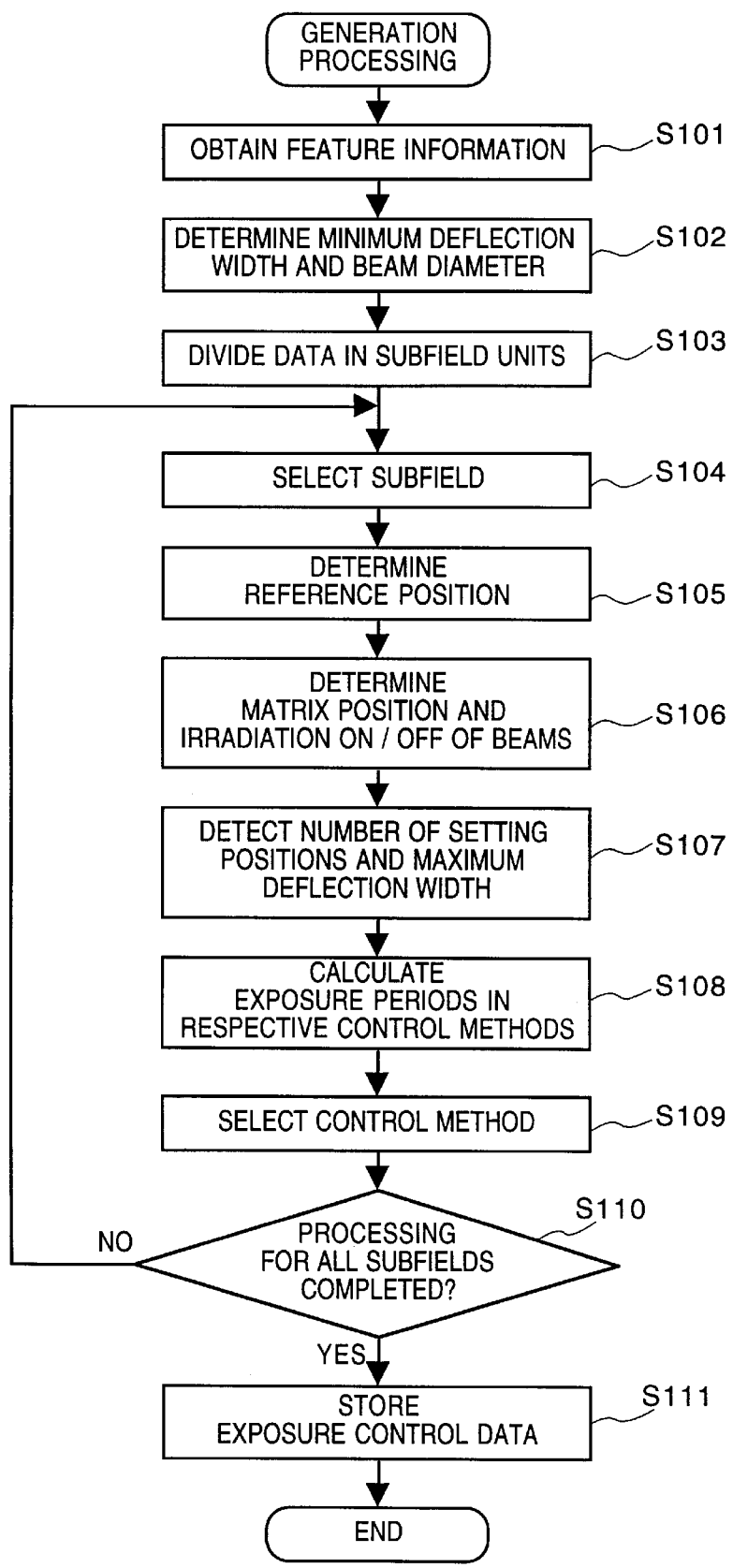
FIG. 9 is a flowchart explaining exposure control data generation processing according to the first embodiment.

When pattern data to be formed on the wafer by exposure has been inputted, the CPU 25 performs exposure control data generation processing as shown in FIG. 9. Hereinafter, the respective steps of the processing will be described.

(Step S101)

Pattern feature information (minimum line width, line width type and shape) is obtained from the pattern data. In the present embodiment, the minimum line width is obtained.

(Step S102)

The minimum deflection width of deflection by the sub deflector 62 and the electron beam diameter (the size of electron-source image formed on the wafer) of electron beams are determined based on the pattern information obtained at step S101. In the present embodiment, the determination is made such that the matrix pitch among the plurality of electron beams on the wafer 5 is an integer multiple of the minimum deflection width, and the minimum deflection width is about ¼ of the minimum line width, further, the electron beam diameter is substantially equal to a circumscribed circle diameter in a square having the minimum deflection width as its side.

(Step S103)

The input pattern data is divided into data in units of subfields determined by the electron-beam exposure apparatus of the present embodiment.

(Step S104)

One subfield is selected.

(Step S105)

The deflection positions (reference positions) in exposure of the selected subfield determined by the main deflector 61 are determined.

(Step S106)

The pattern data for the selected subfield is divided into pattern data for respective elementary exposure fields of the respective elementary electron optical systems. A common matrix composed of matrix elements FMEs (See FIGS. 10A and 10B) is set, with the minimum deflection width of the sub deflector 62 determined at step S102 as the matrix spacing, and the pattern data is converted into data represented on the common matrix, for the respective elementary electron optical systems. Hereinafter, for the sake of simplicity, processing on pattern data for exposure by using two elementary electron optical systems a and b will be described.

FIGS. 10A and 10B show patterns Pa and Pb on a common deflection matrix DM to be formed by exposure by the adjacent elementary electron optical systems a and b. More specifically, the elementary electron optical systems emit electron beams onto the wafer by turning off the blanking electrodes at hatched matrix positions of pattern portions. For this purpose, the CPU 25 determines first regions FFs (hatched portions) of the matrix positions exposed by at least one of the elementary electron optical systems a and b, and second regions NNs (blank portions) of matrix positions not exposed by any of the elementary electron optical systems a and b, as show in FIG. 10C, from the matrix position data for exposure in units of elementary electron optical systems as shown in FIGS. 10A and 10B. When a plurality of electron beams are located in the first region FF on the matrix, exposure is made by deflecting the electron beams by the sub deflector 62 by the minimum deflection width (matrix spacing) as the exposure unit, thus all the patterns are formed on the wafer by exposure. When a plurality of electron beams are located in the second region NN on the matrix, the electron beams are not set but merely deflected, thereby exposure is made while eliminating unnecessary deflection of the electron beams and omitting unnecessary control data. In other words, when exposure of the first field FF has been made, the electron beams are deflected to the next first filed FF while skipping over the second region NN. This enables exposure for a shorter period by reducing deflection operations requiring setting periods.

The CPU 25 determines the matrix positions of matrix elements for exposure based on data on the regions FFs and NNs shown in FIG. 10C. Further, the CPU 25 determines the on/off patterns of blanking electrodes for the respective elementary electron optical systems corresponding to the matrix positions where the electron beams are set, from data representing the patterns shown in FIGS. 10A and 10B. In this manner, data for the vector-scan control method is generated. Note that as the minimum deflection width and the deflection order in the matrix are already determined, matrix numbers are allotted to the respective matrix elements. The matrix numbers are determined as the matrix positions.

(Step S107)

The number of setting positions in case of exposure of the subfield by the vector-scan control method, and the maximum deflection width from a setting position of the sub deflector 62 to the next setting position are calculated from the data obtained at step S106.

(Step S108)

From experimentally-obtained relation between the maximum deflection width and the setting waiting period, a setting waiting period To(V) in case of exposure of the subfield by the vector-scan control method is obtained based on the maximum deflection width calculated at step S107. Further, a setting waiting period To(R) in case of exposure of the subfield by the raster-scan control method is obtained based on the maximum deflection width in the raster-scan control method (equal to the minimum deflection width). From the setting period Ts, the deflection periods of the respective methods are obtained:

deflection period in vector-scan control method:

$$Td(V)=To(V)+Ts$$

deflection period in raster-scan control method:

$$Td(R)=To(R)+Ts$$

Further, from a number of setting positions N(V) in the vector-scan control method and a number of setting positions N(R) in the raster-scan control method, subfield exposure periods of the respective method are calculated;

Exposure period in vector-scan control method:

$$Tsub(V)=Td(V)\times N(V)$$

Exposure period in raster-scan control method:

$$Tsub(R)=Td(R)\times N(R)$$

(Step S109)

The exposure periods of the respective control methods calculated at step S108 are compared to each other, and the control method of shorter exposure period is employed as a control method for exposure of the subfield.

(Step S110)

It is determined whether or not the processing at steps S104 to S109 has been performed on all the subfields. If any unprocessed subfield exists, the process returns to step S104 to select the unprocessed subfield.

(Step S111)

If the processing at steps S104 to S109 has been performed on all the subfields, exposure control data on the minimum deflection width of the sub deflector 62, and the electron beam diameter, and subfield-base exposure control data on the reference positions determined by the main deflector 61, the control method, the deflection period of the sub deflector 62 corresponding to the control method, the matrix positions determined by the sub deflector 62, and electron-beam irradiation on/off of the respective elementary electron optical systems at the respective matrix positions, as shown in FIG. 11, are stored in the memory 23. Note that in case of the vector-scan control method, data on matrix positions where all the electron beams are cut off is removed. Further, in case of the raster-scan control method, data on all the matrix positions within the subfield determined by the minimum deflection width of the sub deflector 62 is stored.

Note that in the present embodiment, these processings are performed by the CPU 25 of the electron-beam exposure apparatus, however, even in a case where these processings are performed by another processor and the exposure control data is transferred to the CPU 25, the purpose and advantages of the present invention are the same.

<Exposure Operation Based on Exposure Control Data in FIG. 11>

Figure 12:
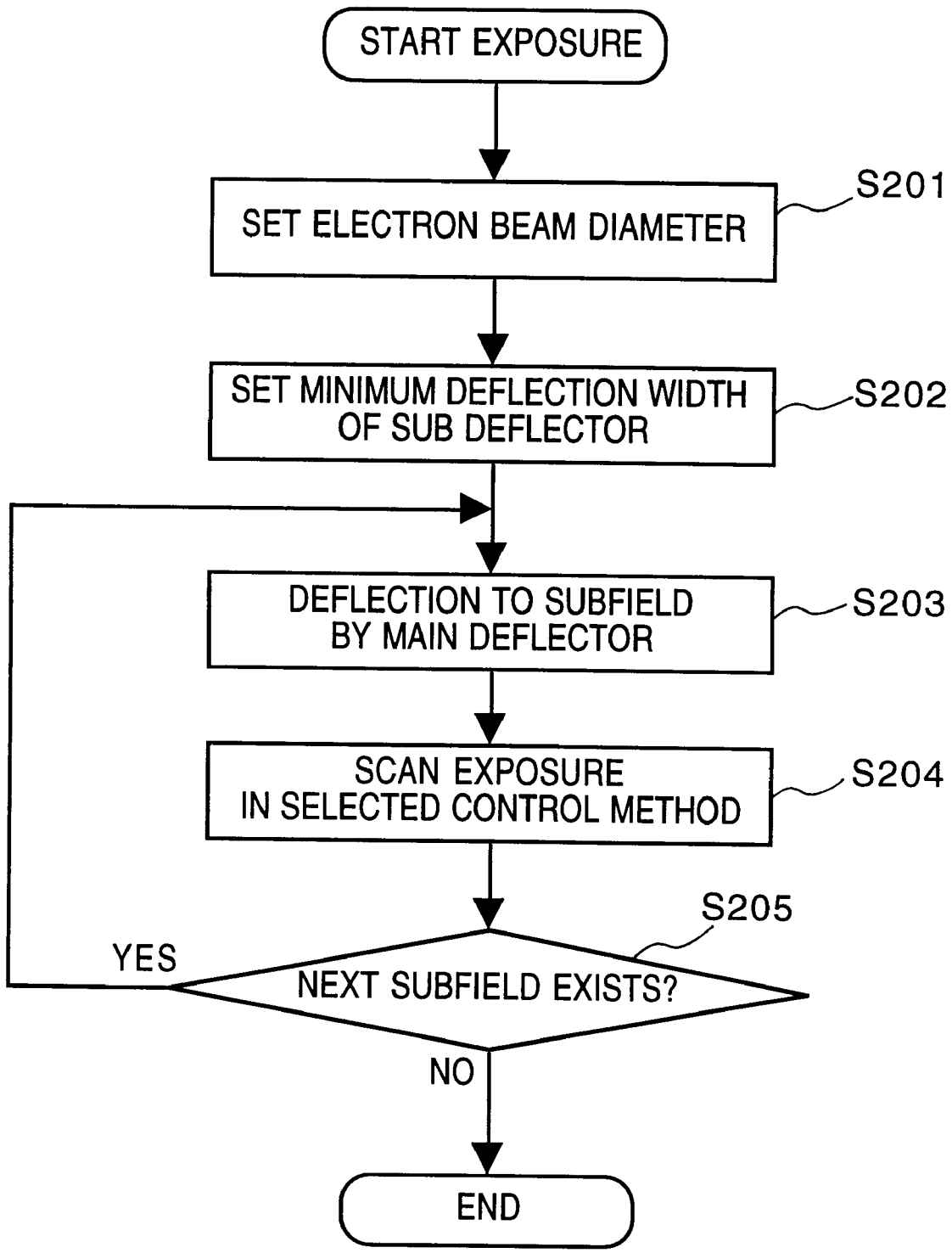
FIG. 12 is a flowchart explaining an exposure process procedure based on the exposure control data according to the first embodiment.

When the CPU 25 instructs the control system 22 to execute exposure via the interface 24, the control system 22 executes processing steps as shown in FIG. 12, based on the transferred exposure control data (FIG. 11) on the memory 23. Hereinbelow, the respective steps will be described.

(Step S201)

The control system 22 instructs the focal-distance control circuit FC to change the focal distance of the illumination electron optical system 2, to set the electron beam diameter to that determined at step S102 (data "W" in FIG. 11).

(Step S202)

The control system 22 instructs the deflection control circuit 17 to set the minimum deflection width of the sub deflector 61 to that determined at step S102 (data "def" in FIG. 11).

(Step S203)

The control system 22 instructs the deflection control circuit 17 to deflect a plurality of electron beams by the main deflector 61 into a subfield to be exposed such that the plurality of electron beams from the elementary electron optical system array 3 are positioned at the reference positions as the exposure start points. Further, in correspondence with the deflection positions determined by the main deflector 61, the control system 22 instructs the second focal point/astigmatism control circuit 17 to control the dynamic focus coil 7 to correct the focal point position of the reduction electron optical system 4 based on pre-obtained dynamic focal-point correction data, and to control the dynamic stigmatic coil 8 to correct astigmatism of the reduction electron optical system 4.

(Step S204)

The control system 22 instructs the deflection control circuit 17 to change the deflection period of the sub deflector 62 to that corresponding to the control method of the subfield to be exposed, and issue a periodic signal determined by the deflection period. Then, the control system 22 instructs the deflection control circuit 17 to control the sub deflector 62 to deflect the plurality of electron beams from the elementary electron optical system array 3 to the deflection positions determined by the exposure control data, by the changed minimum deflection width, in synchronization with the periodic signal. At the same time, the control system 22 instructs the blanking control circuit 14 to turn on/off the blanking electrodes of the respective elementary electron optical systems in correspondence with the pattern to be formed, in synchronization with the periodic signal. Note that if the vector-scan control method is selected as the control method, at deflection positions where all the electron beams are cut off, the plurality of electron beams are not set but merely deflected. In other words, the electron beams are deflected from a first deflection position where at least one of the electron beams is emitted, to the next first deflection position where at least one of the electron beams is emitted, while skipping over a second deflection position where all the electron beams are cut off. Further, if the raster-scan control method is selected as the control method, the electron beams are deflected by a constant deflection width (minimum deflection width) and set at the deflection positions. Further, to correct blurring of electron beams due to the Coulomb effect, the control system 22 instructs the refocus control circuit 19 to adjust the focal point position of the reduction electron optical system 4 by the refocus coil 9, based on the number of electron beams which are not cut off by the blanking electrodes and emitted on the wafer. At this time, the X-Y stage 12 is continuously moving in the X-direction. The deflection control circuit 17 controls the deflection of the electron beams in consideration of the moving amount of the X-Y stage 12. As described above, as shown in FIG. 6A, each electron beams scans each elementary exposure field EF on the wafer 5 from the solid black rectangular portion as a start point. Further, as shown in FIG. 6B, the elementary exposure fields EFs of the plurality of elementary electron optical systems in one subarray are adjacent to each other, therefore, on the wafer 5, the subarray exposure field SEF composed of the plurality of elementary exposure fields EFs is exposed. At the same time, on the wafer 5, the subfield composed of the subarray exposure fields SEFs A to E as shown in FIG. 7A is exposed.

(Step S205)

If there is a subfield to be exposed next, the process returns to step S203, while there is no subfield to be exposed next, the exposure is terminated.

In the first embodiment, the exposure periods of the respective control methods are calculated, and the control method having a shorter exposure period is selected. However, it may be simply arranged such that the raster-scan control method is selected if the number of setting positions in the vector-scan control method is equal to or greater than a predetermined value, e.g., the half of the number of setting positions in the raster-scan control method.

As described above, according to the first embodiment, as an appropriate control method is selected by each subfield based on pattern data, a multi electron-beam exposure apparatus and method which attains higher throughput can be provided.

SECOND EMBODIMENT

<Constituents of Electron-Beam Exposure Apparatus>

Figure 13:
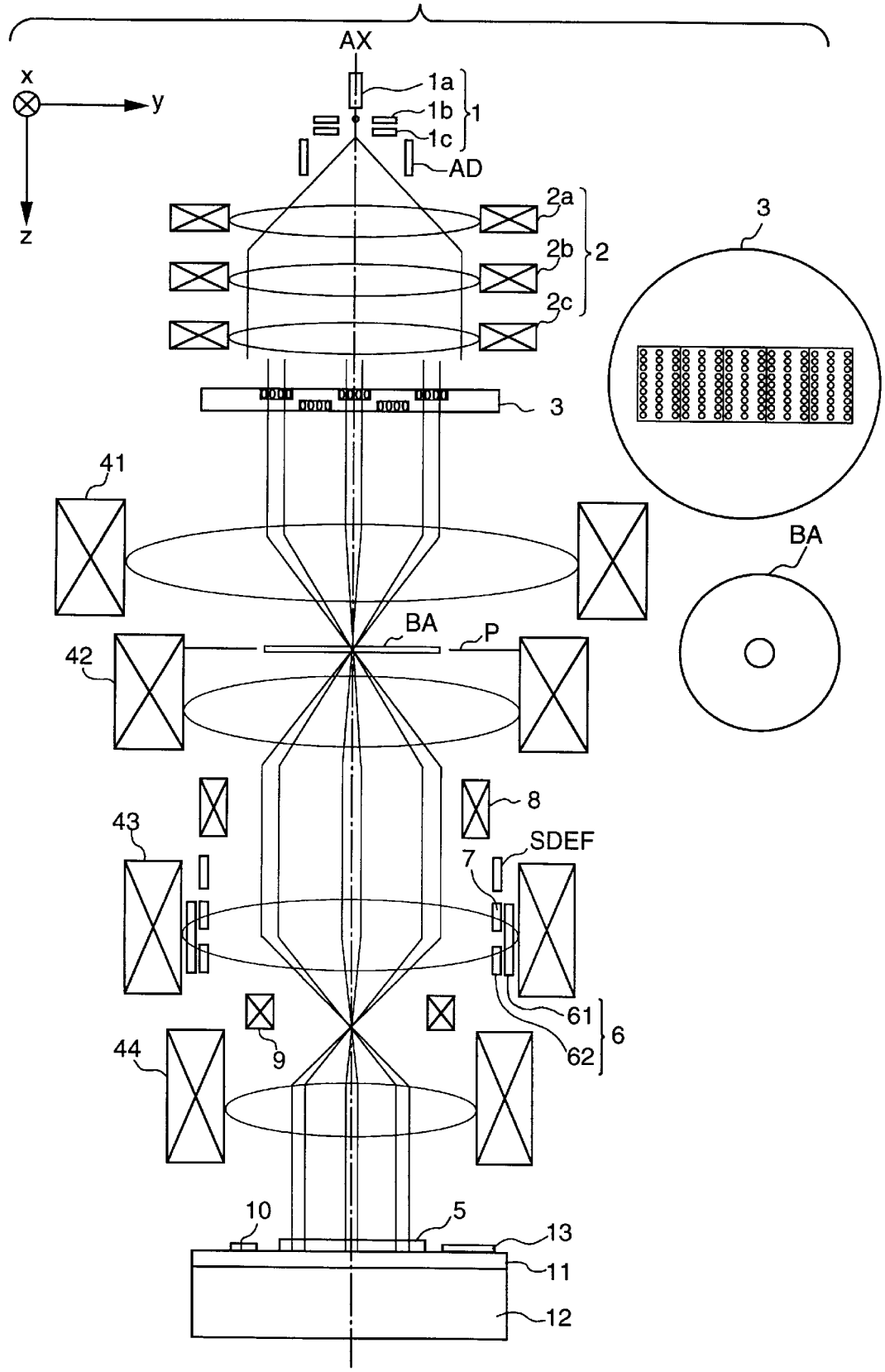
FIG. 13 is a schematic view of a principal part of the electron-beam exposure apparatus according to a second embodiment of the present invention.

FIG. 13 is a schematic view of a principal part of the electron-beam exposure apparatus according to a second embodiment of the present invention. In FIG. 13, elements corresponding to those of the first embodiment (FIG. 1) have the same reference numerals.

In comparison with FIG. 1, the difference from the first embodiment is that in FIG. 13, a stage following deflector SDEF is provided between the dynamic focus coil 7 and the dynamic stigmatic coil 8. The stage following deflector SDEF is a deflector to deflect electron beams from the elementary electron optical system array 3 to follow the continuous movement of the X-Y stage 12. Note that the stage following deflector SDEF is an electrostatic deflector.

Further, the detailed construction of the elementary electron optical system array 3 is as described in FIG. 2, FIGS. 3A to 3C, and FIGS. 4A and 4B.

Figure 14:
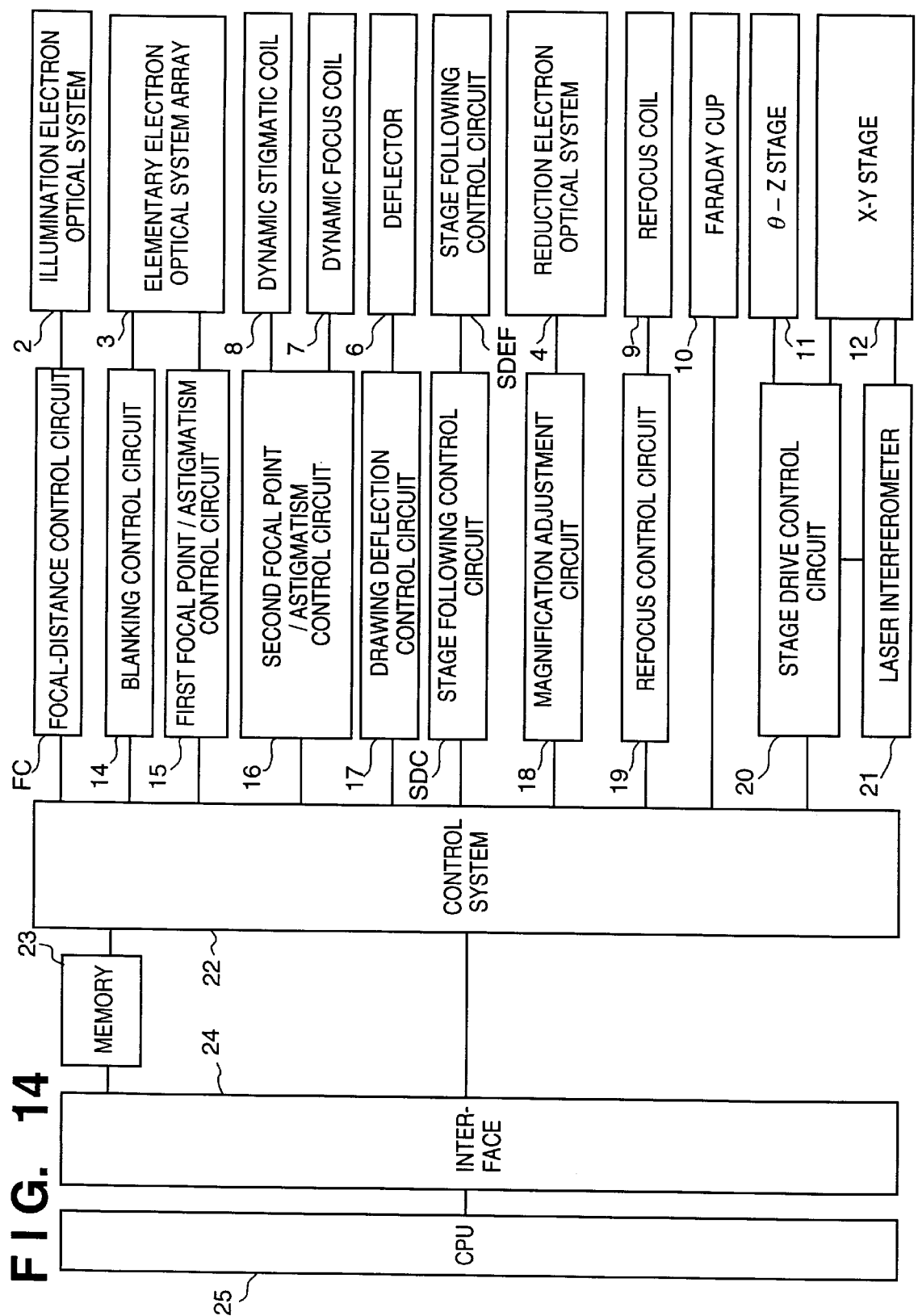
FIG. 14 is a block diagram showing the system arrangement of the electron-beam exposure apparatus according to the second embodiment of the present invention.

FIG. 14 shows the system arrangement of the electron-beam exposure apparatus of the second embodiment. In FIG. 14, elements corresponding to those of the first embodiment (FIG. 5) have the same reference numerals. The stage following control circuit SDC controls the stage following deflector SDEF such that the electron beams follow the continuous movement of the X-Y stage 12.

<Exposure Operation>

The exposure operation of the electron-beam exposure apparatus of the second embodiment will be described with reference to FIG. 15.

The control system 22 instructs the deflection control circuit 17 to deflect a plurality of electron beams from the elementary electron optical system array 3 by the sub deflector 62 of the deflector 6, based on exposure control data from the memory 23, and instructs the blanking control circuit 14 to turn on/off the blanking electrodes of the respective elementary electron optical systems in accordance with a pattern to be formed on the wafer 5. At this time, the X-Y stage 12 is continuously moving in the X-direction. The control system 22 instructs the stage following control circuit SDC to deflect the plurality of electron beams by the stage following deflector SDEF such that the electron beams follow the movement of the X-Y stage 12. In this manner, the electron beams from the elementary electron optical systems scan and irradiate the elementary exposure fields EFs on the wafer 5, as shown in FIG. 15. In the present embodiment, the size of the elementary exposure field EF is Sx=Sy=4 µm. In the elementary electron optical system array 3, the plurality of elementary exposure areas EFs of the plurality of elementary electron optical systems are two-dimensionally arranged so as to be adjacent to each other. As a result, on the wafer 5, the subfield SF composed of the plurality of elementary exposure fields EFs, two-dimensionally arranged, adjacently to each other, to be simultaneously exposed, is exposed. In the present embodiment, the plurality of elementary exposure fields EFs are arranged in M(X-direction)×N(Y-direction) matrix (M=64, N=64). The size of the subfield SF is 256×256 $\mu m^2$.

Figure 15:
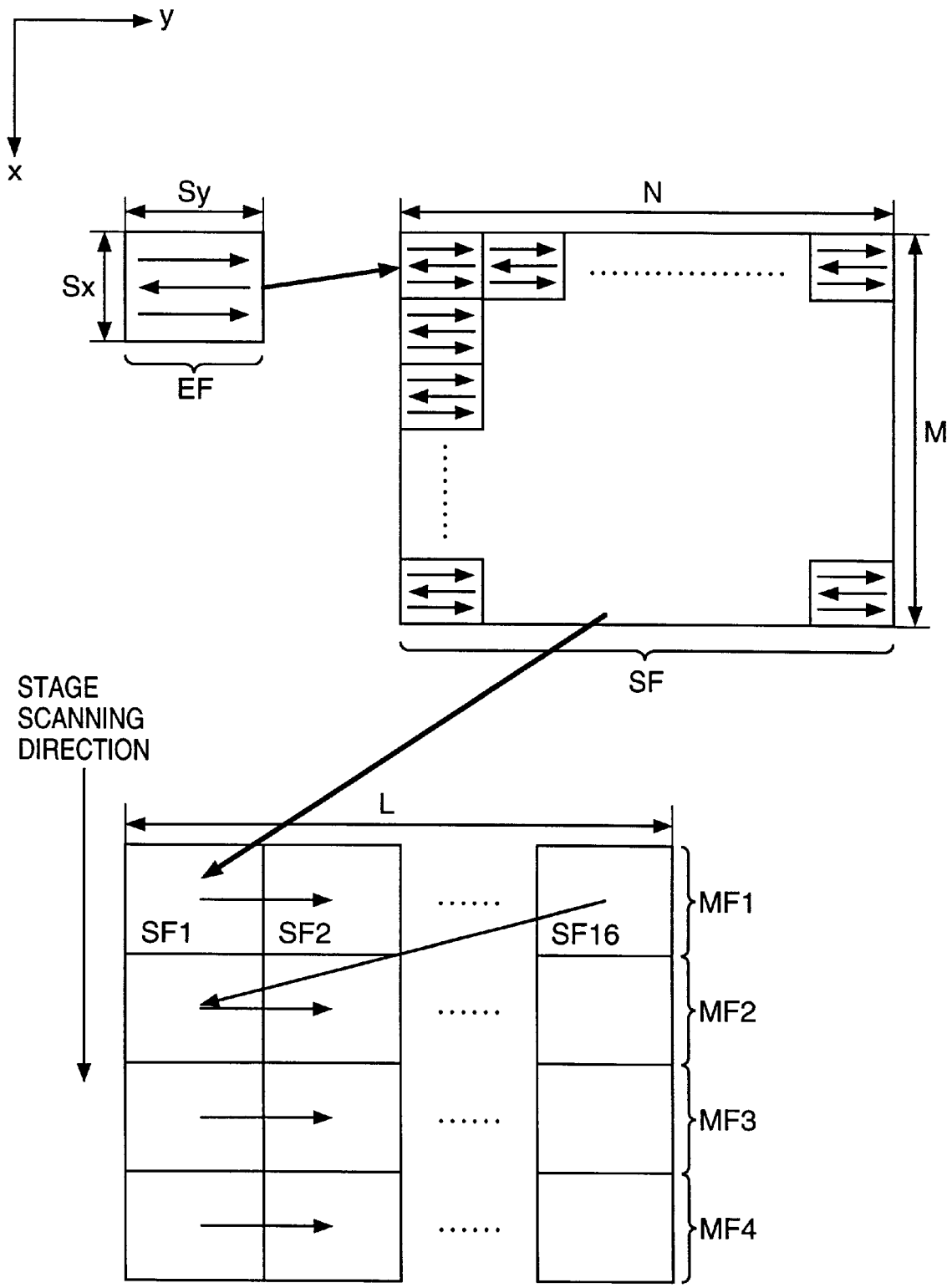
FIG. 15 is an explanatory view showing the exposure field (EF), the subfields (SFs) and main fields (MFs) of the second embodiment.

When a subfield SF1 in FIG. 15 has been exposed, to perform exposure on the next subfield SF2, the control system 22 instructs the deflection control circuit 17 to deflect the plurality of electron beams from the elementary electron optical system array 3 by the main deflector 61 of the deflector 6, in a direction orthogonal to a stage scanning direction. As described above, the control system 22 again instructs the deflection control circuit 17 to deflect the plurality of electron beams from the elementary electron optical system array 3 by the sub deflector 62 of the deflector 6, and instructs the blanking control circuit 14 to turn on/off the blanking electrodes of the respective elementary electron optical systems in accordance with the pattern to be formed, thus performs exposure of the subfield SF2. As shown in FIG. 15, the subfields SF1 to SF16 are sequentially exposed and patterns are formed on the wafer 5. As a result, on the wafer 5, a main field (MF) composed of the subfields SF1 to SF16 arrayed in the direction orthogonal to the stage scanning direction is exposed. Note that 16 subfields SFs are arrayed in the Y-direction (L=16) to form the main field MF. The size of the main field MF is 256×4096 $\mu m^2$.

When a main filed MF1 in FIG. 15 has been exposed, the control system 22 instructs the deflection control circuit 17 to deflect the plurality of electron beams from the elementary electron optical system array 3 to sequentially irradiate the main fields arrayed in the stage scanning direction (MF2, MF3, MF4 . . . ), thus forming the patterns on the wafer 5.

That is, the electron-beam exposure apparatus of the present embodiment deflects a plurality of electron beams to scan the wafer, and at the same time, respectively controls irradiation of the electron beams upon each deflection, while continuously moving the stage carrying the wafer. Thus, the apparatus writes a pattern on a subfield composed of the plurality of elementary exposure fields by writing a pattern on each of the elementary exposure fields by each of the electron beams. The apparatus writes a pattern on a main field composed of the plurality of subfields by sequentially writing patterns on the plurality of subfields arrayed in a direction orthogonal to the continuous moving direction, further, sequentially writes patterns on the plurality of main fields arrayed in the continuos moving direction.

Note that in the second embodiment, the vector-scan control method or the raster-scan control method is selected by each subfield, based on a drawing pattern (pattern data), as described in the first embodiment.

<Exposure Control Data Generation Processing>

Next, the method for generating the exposure control data for the electron-beam exposure apparatus of the second embodiment will be described.

Figure 16:
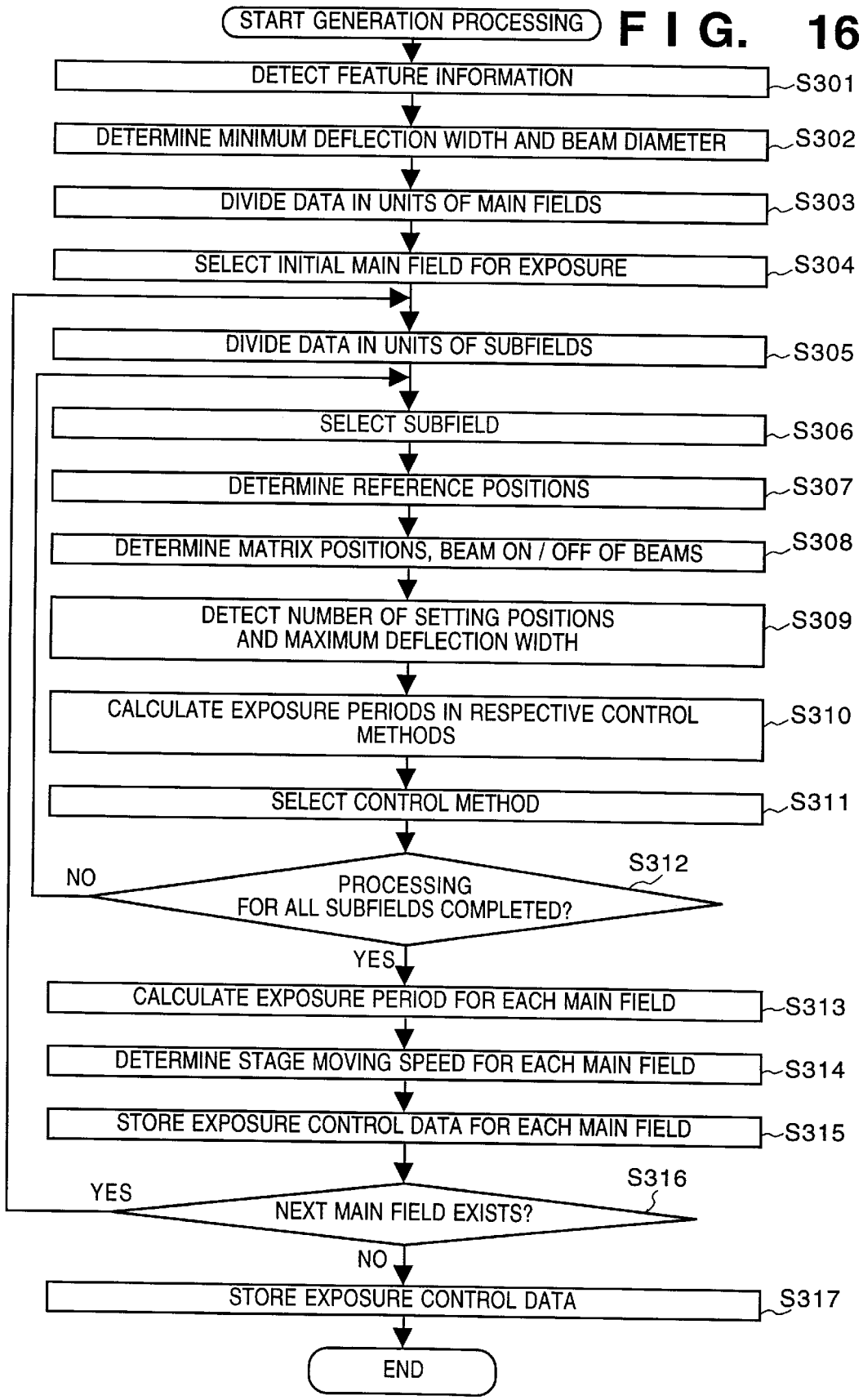
FIG. 16 is a flowchart explaining exposure control data generation processing according to the second embodiment.

When pattern data of a pattern formed on the wafer has been inputted, the CPU 25 executes exposure control data generation processing as shown in FIG. 16. Hereinbelow, the respective steps will be described.

(Step S301)
Feature information (minimum line width, line width type and shape) of the pattern is detected from the pattern data. In the present embodiment, the minimum line width is detected.

(Step S302)
The minimum deflection width of the sub deflector 62 and the electron beam diameter (the size of electron-source image formed on the wafer) are determined based on the detected feature information. In the present embodiment, the determination is made such that the matrix pitch (on the wafer) among a plurality of electron beams is an integer multiple of the minimum deflection width, and the minimum deflection width is substantially ¼ of the minimum line width, further, the electron beams diameter is substantially equal to a circumscribed circle diameter in a square having the minimum deflection width as its side.

(Step S303)
The input pattern data is divided into data in units of main fields determined by the electron-beam exposure apparatus of the present embodiment.

(Step S304)
Upon exposure, one main field to be exposed first is selected.

(Step S305)
The pattern data for the selected main field is divided in units of subfields determined by the electron-beam exposure apparatus of the present embodiment.

(Step S306)
One subfield is selected.

(Step S307)
The deflection positions (reference positions) for exposure of the selected subfield determined by the main deflector 61 is set.

(Step S308)
The pattern data in the selected subfield is divided into pattern data for respective elementary exposure fields of the respective elementary electron optical systems. A common matrix composed of matrix elements FMEs is set, with the determined minimum deflection width of the sub deflector 62 as the matrix spacing, and the pattern data is converted into data represented on the common matrix, for each elementary electron optical system. Then, as described in the first embodiment, the CPU 25 determines the matrix positions of matrix elements for exposure based on data on the regions FFs and NNs shown in FIG. 10C. Further, the CPU 25 determines the on/off patterns of blanking electrodes for the respective elementary electron optical systems corresponding to the matrix positions where the electron beams are set, based on data representing the patterns shown in FIGS. 10A and 10B, thus generating data for the vector-scan control method. Note that as the minimum deflection width and the deflection order in the matrix are already determined, matrix numbers are allotted to the respective matrix elements. The matrix numbers are determined as the matrix positions.

(Step S309)
The number of setting positions (number of settings) in case of exposure of the subfield by the vector-scan control method, and the maximum deflection width from one setting position of the sub deflector 62 to the next setting position are calculated from the data obtained at step S308.

(Step S309)
From experimentally-obtained relation between the maximum deflection width and the setting waiting period, the setting waiting period To(V) in case of exposure of the subfield by the vector-scan control method is obtained based on the detected maximum deflection width in the vector-scan control method. Further, the setting waiting period To(R) in case of exposure of the subfield by the raster-scan control method is obtained based on the maximum deflection width in the raster-scan control method (equal to the minimum deflection width). From the setting period Ts, the deflection periods of the respective methods are obtained:

deflection period in vector-scan control method:

$$Td(V)=To(V)+Ts$$

deflection period in raster-scan control method:

$$Td(R)=To(R)+Ts$$

Further, from the number of setting positions N(V) in the vector-scan control method and the number of setting positions N(R) in the raster-scan control method, subfield exposure periods of the respective method are calculated;

Exposure period in vector-scan control method:

$$Tsub(V)=Td(V)\times N(V)$$

Exposure period in raster-scan control method:

$$Tsub(R)=Td(R)\times N(R)$$

(Step S311)

The exposure periods of the respective control methods are compared to each other, and the control method of shorter exposure period is employed as a control method for exposure of the subfield;

(Step S312)

It is determined whether or not the processing at steps S307 to S311 has been performed on all the subfields in the selected main field. If any unprocessed subfield exists, the process returns to step S306 to select the unprocessed subfield. Otherwise, the process proceeds to step S313.

(Step S313)

The exposure periods by the selected control methods in the respective subfields in the selected main field are added up, to calculate an exposure period for the selected main field.

(Step S314)

Figure 17A:
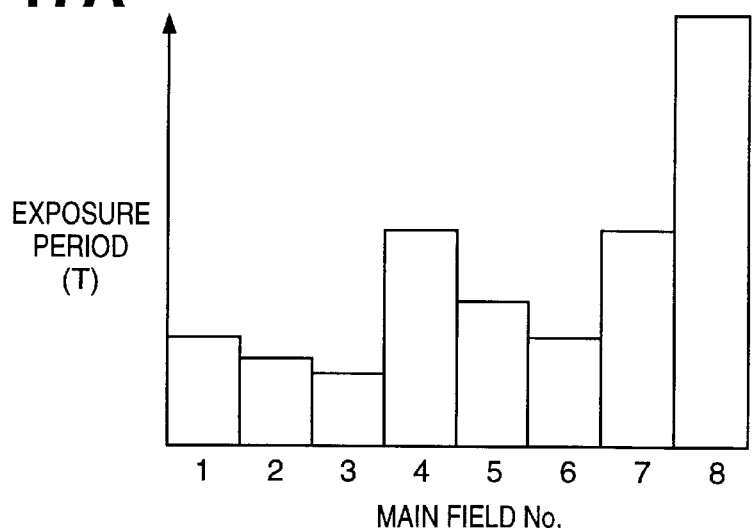
FIG. 17A is a histogram showing the relation between main fields and an exposure period.
Figure 17B:
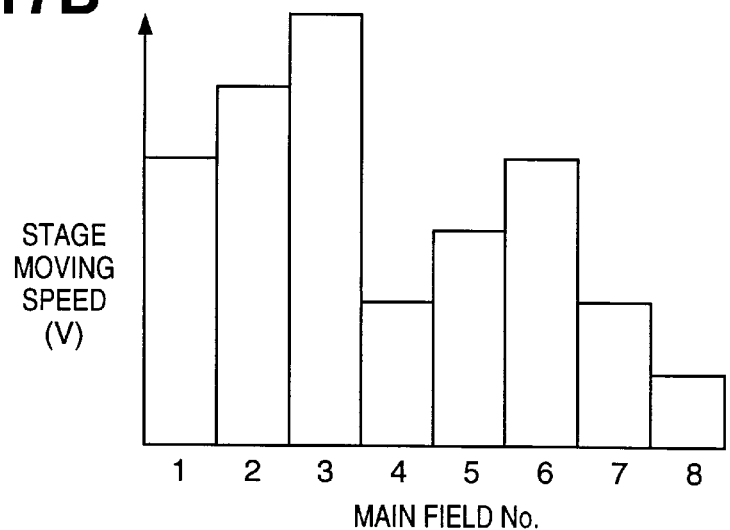
FIGS. 17B to 17C are histograms explaining the relation between the main fields and a stage moving speed.

The moving speed of the stage in exposure of the main field is determined based on the exposure period for the selected main field. FIG. 17A shows an example of relation between the respective main fields (MF(N)) and exposure period (T(n)). As described above, if the vector-scan control method is selected in a subfield of the main field, as a plurality of electron beams are set at deflection positions where at least one electron beams is emitted, and the electron beams are not set but merely deflected at deflection positions where all the plurality of electron beams are cut off, the exposure periods of the respective main fields may be different. Then, at step S314, the stage moving speed (V(n)) in inverse proportion to the exposure period is determined. For example, as the length (LMF) of the main field in the stage moving direction is 256 µm, if exposure period T(n)=2.56 ms holds, the stage moving speed is V(n)=100 mm/s(=LMF/T(n)). FIG. 17B shows the relation between the respective main fields and the stage moving speed. As exposure is performed with the stage moving speed for each main field in correspondence with the exposure period of each main field, the wafer is exposed for a shorter period. In a conventional multi electron-beam exposure apparatus, as the stage is moved at a constant speed, when exposure region moves from a main field where the exposure needs a short exposure period to a next main field, exposure must be stopped. However, in the present invention, the exposure is not stopped in such manner.

(Step S315)

Data on the stage moving speed for the selected main field, subfield-base data on the reference positions determined by the main deflector 61, the control method, the deflection period of the sub deflector 62 corresponding to the control method, the matrix positions determined by the sub deflector 62, and electron-beam irradiation on/off of the respective elementary electron optical systems, in the selected main field, are stored. Note that in case of the vector-scan control method, data on matrix positions where all the electron beams are cut off is removed. In case of the raster-scan control method, data on all the matrix positions within the subfield determined by the minimum deflection width of the sub deflector 62 is stored.

(Step S316)

If there is any main field to be exposed next, the main field is selected, and the process returns to step S305. If there is no main field to be exposed next, the process proceeds to step S317.

(Step S317)

Exposure control data having data elements on the minimum deflection width of the sub deflector 62, the electron-beam diameter, and subfield-base data on the reference positions determined by the main deflector 61, the control method, the deflection period of the sub deflector 62 corresponding to the control method, the matrix positions determined by the sub deflector 62, and electron-beam irradiation on/off of the respective elementary electron optical systems, as shown in FIGS. 18A and 18B, are stored in the memory 23.

Note that in the present embodiment, these processings are performed by the CPU 25 of the electron-beam exposure apparatus, however, even in a case where these processings are performed by another processor and the exposure control data is transferred to the CPU 25, the purpose and advantages of the present invention are the same.

<Exposure Based on Exposure Control Data>

Figure 19:
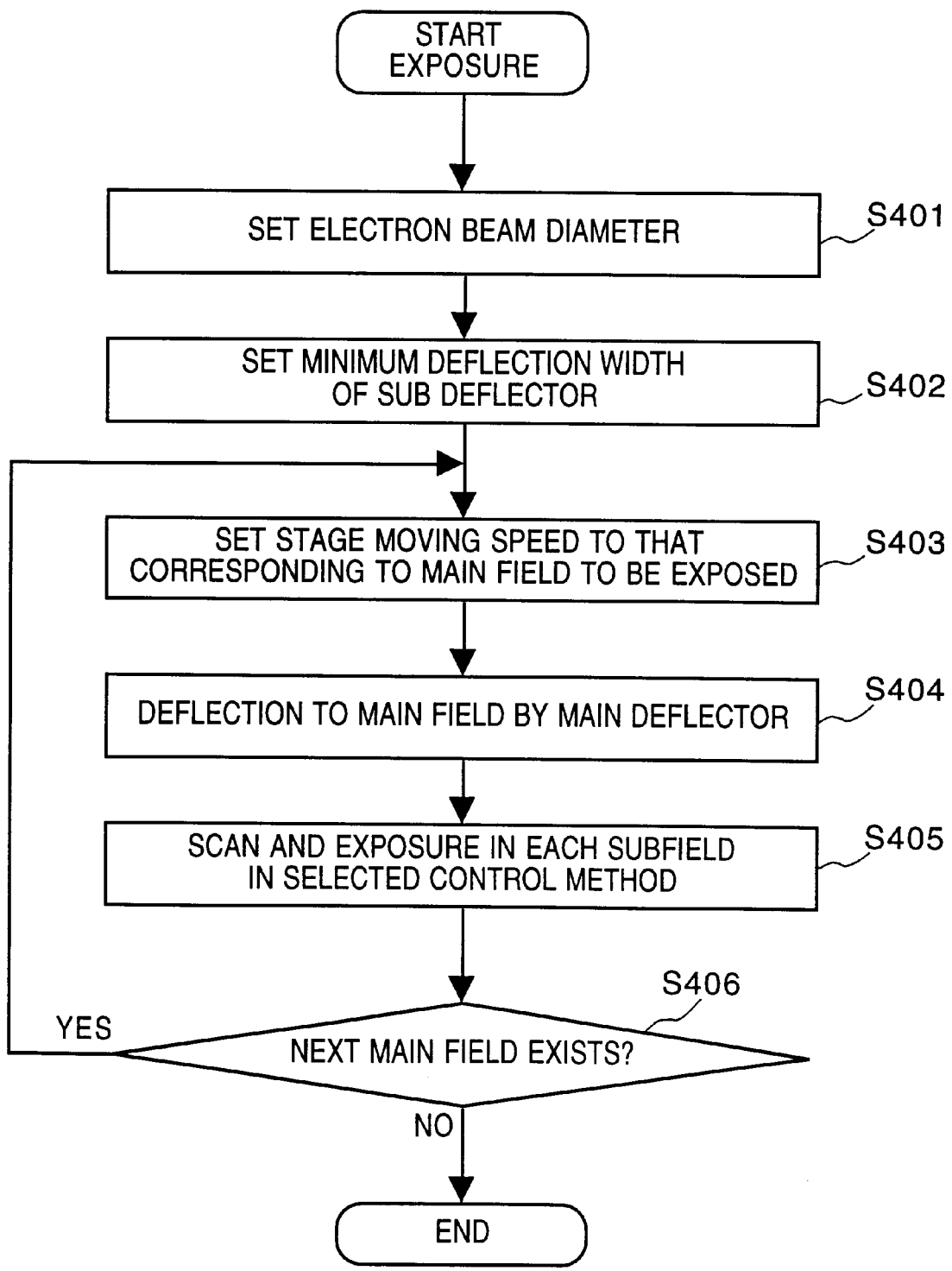
FIG. 19 is a flowchart explaining the exposure processing procedure based on the exposure control data according to the second embodiment.

The CPU 25 instructs the control system 22 to execute exposure via the interface 24, and the control system 22 executes processing steps as shown in FIG. 19 based on the above exposure control data. Hereinbelow, the respective steps will be described.

(Step S401)

The control system 22 instructs the focal-distance control circuit FC to change the focal distance of the illumination electron optical system 2, and set the electron beam diameter to that determined at step S302 (data "W" in FIG. 18A).

(Step S402)

The control system 22 instructs the deflection control circuit 17 to set the minimum deflection width of the sub deflector 61 to that determined at step S302 (data "def" in FIG. 18A).

(Step S403)

The control system 22 instructs the stage drive control circuit 20 to change the stage moving speed to that corresponding to a main field to be exposed, and controls the X-Y stage 12. The stage moving speed is determined for each main field at above-described step S314, and held as "Stage Speed" V(1), V(2), . . . in the table as shown in FIG. 18A.

(Step S404)

The control system 22 instructs the deflection control circuit 17 to deflect a plurality of electron beams from the elementary electron optical system array 3 by the main deflector 61 to a subfield to be exposed first such that the electron beams are positioned at the reference positions in the subfield in the main field.

(Step S405)

The control system 22 instructs the deflection control circuit 17 to change the deflection period of the sub deflector 62 to that corresponding to the control method of the subfield to be exposed, and at the same time, to issue a periodic signal determined by the deflection period. Then, the control system 22 deflects the plurality of electron beams from the elementary electron optical system array 3 by the sub deflector 62 to the deflection positions determined by the exposure control data, by the minimum deflection width, in synchronization with the periodic signal. At the same time, the control system 22 instructs the blanking control circuit 14 to turn on/off the blanking electrodes of the respective elementary electron optical systems in correspondence with a pattern to be formed on the wafer 5, in synchronization with the periodic signal. Note that if the vector-scan control method is selected as the control method, the plurality of electron beams are not set but merely deflected at deflection positions where all the electron beams are cut off. In other words, the electron beams are deflected from a first deflection position where at least one of the electron beams is emitted, to the next first deflection position where at least one of the electron beams is emitted, while skipping over a second deflection position where all the electron beams are cut off. Further, if the raster-scan control method is selected as the control method, the electron beams are deflected by a constant deflection width (minimum deflection width) and set at the respective deflection positions. Further, to correct blurring of electron beams due to the Coulomb effect, the control system 22 instructs the refocus control circuit 19 to adjust the focal point position of the reduction electron optical system 4 by the refocus coil 9, based on the number of electron beams which are not cut off by the blanking electrodes and emitted on the wafer. At this time, the X-Y stage 12 is continuously moving in the direction X, while the deflection control circuit 17 controls the deflection of the electron beams. As described above, as shown in FIG. 15, each of the electron beams from the elementary electron optical systems scans each elementary exposure field EF on the wafer 5. The plurality of elementary exposure fields EFs of the plurality of elementary electron optical systems in the elementary electron optical system array 3 are two-dimensionally arranged adjacently to each other, therefore, on the wafer 5, the subfield SF composed of the simultaneously-exposed plurality of elementary exposure areas EFs is exposed. When the subfield SF1 in FIG. 15 has been exposed, to perform exposure on the next subfield SF2, the control system 22 instructs the deflection control circuit 17 to deflect the plurality of electron beams from the elementary electron optical system array 3 by the main deflector 61 of the deflector 6, in a direction orthogonal to a stage scanning direction. As described above, the control system 22 again instructs the deflection control circuit 17 to deflect the plurality of electron beams from the elementary electron optical system array 3 by the sub deflector 62 of the deflector 6, and instructs the blanking control circuit 14 to turn on/off the blanking electrodes of the respective elementary electron optical systems in accordance with the pattern to be formed, thus performing exposure of the subfield SF2. As shown in FIG. 15, the subfields SF1 to SF16 are sequentially exposed and patterns are formed on the wafer 5. As a result, on the wafer 5, one main field MF composed of the subfields SF1 to SF16 arrayed in the direction orthogonal to the stage scanning direction is exposed.

(Step S406)

If there is any main field to be exposed next, the process returns to step S203. Otherwise, the exposure is terminated.

Note that in the second embodiment, the exposure control method for each subfield may be determined based on the number of setting positions in the vector-scan control method, as described in the first embodiment.

THIRD EMBODIMENT

In the second embodiment, the stage moving speed is determined for each main field in inverse proportion to the exposure period for exposure of the main field. However, if the difference between stage moving speeds for adjacent main fields in the continuous moving direction is large, the stage moving speed is greatly accelerated between the main fields, which disturbs stage control and degrades stage positional stability. Then, in a third embodiment, a once-determined fast moving speed of a main field is re-set to a lower speed such that the difference between moving speeds for adjacent main fields in the continues moving direction is equal to or less than a predetermined value (Vp).

Next, the processing of the third embodiment will be described with reference to FIG. 20.

(Step S501)

The relation between the respective main fields and the stage moving speed determined in the first embodiment (FIG. 17B) is inputted.

(Step S502)

A main field to be exposed first is selected, and a re-determination flag F is set to "0" (F=0).

(Step S503)

The difference between the stage moving speed for the selected main field and that for a main field to be exposed immediately before exposure of the selected main field is calculated. Note that if there is no preceding main field, the process skips to step S505. If the calculated difference is not equal to or less than the predetermined value Vp, the process proceeds to step S504. If the difference is equal to or less than the predetermined value Vp, the process skips to step S505.

(Step S504)

The faster moving speed is re-determined such that the difference between moving speeds becomes equal to or less than the predetermined value Vp. The re-determination flag F is set to "1" (F=1).

(Step S505)

The difference between the stage moving speed for the selected main field and that for a main field to be exposed immediately after exposure of the selected main field is calculated. Note that if there is no subsequent main field, the process skips to step S507. If the calculated difference is not equal to or less than a predetermined value Vp, the process proceeds to step S506. On the other hand, if the difference is equal to or less than the predetermined value Vp, the process skips to step S507.

(Step S506)

The faster moving speed is re-determined such that the difference of moving speeds becomes equal to or less than the predetermined value Vp.

(Steps S507 and S508)

The main field to be exposed immediately after exposure of the selected main field is selected, and the process returns to step S503. Further, if there is no immediately subsequent main field, the process proceeds to step S509.

(Step S509)

If the value of the re-determination flag is "1" (F=1), the process returns to step S502. If the value is "0" (F=0), the process ends.

Figure 17C:
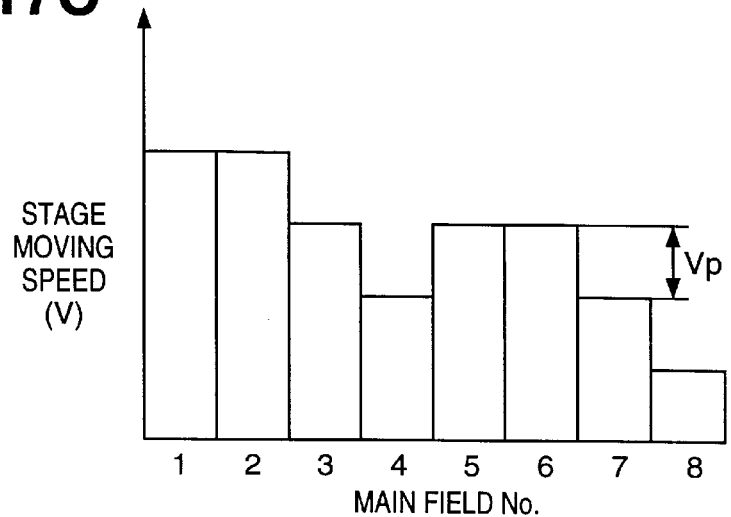
Figure 20:
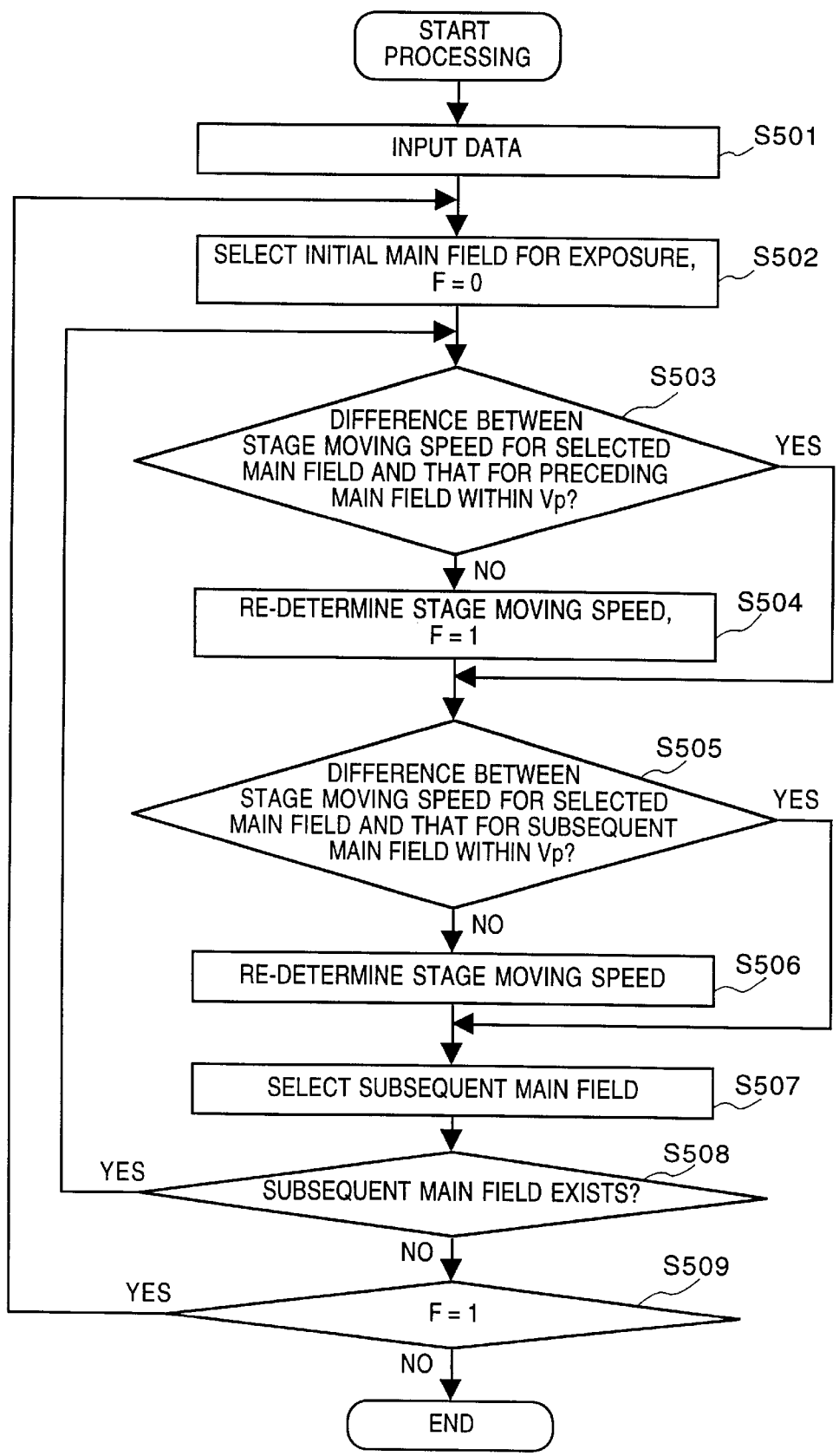
FIG. 20 is a flowchart explaining a method for determining the stage moving speed for each main field according to a third embodiment.

FIG. 17C shows the relation between the respective main fields and the stage moving speed as the results of the processing in FIG. 20.

FOURTH EMBODIMENT

Figure 21:
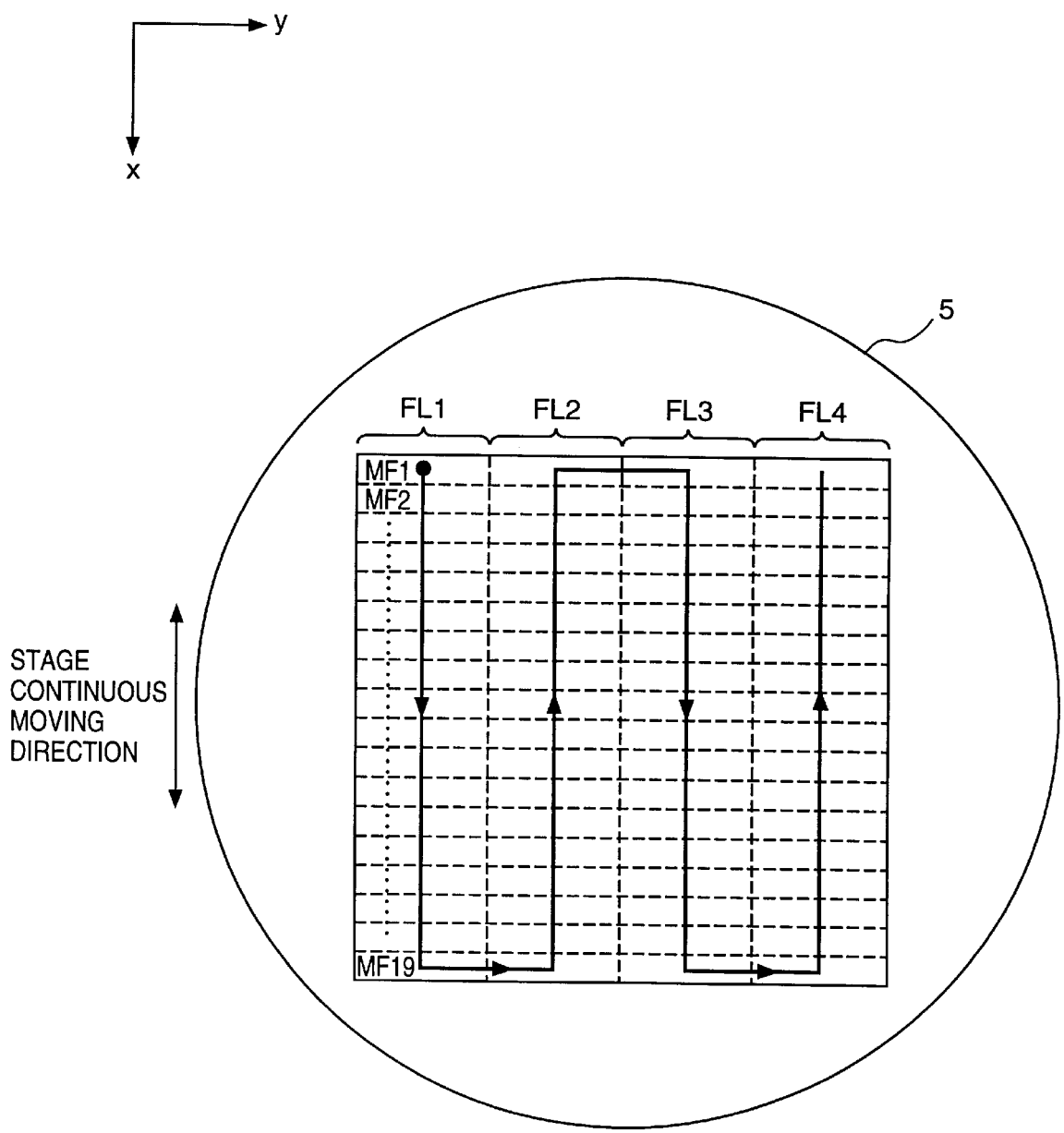
FIG. 21 is an explanatory view showing stage movement on frames according to a fourth embodiment.

In the fourth embodiment, as shown in FIG. 21, when a frame (FL1) composed of a plurality of main fields arrayed in the continuous moving direction of the X-Y stage 12 in an exposure region on the wafer 5 has been exposed, the X-Y stage 12 is step-moved in the Y-direction, to reverse the continuous moving direction, then the next frame (FL2) is exposed. That is, the frames arrayed in a direction orthogonal to the continuous moving direction are sequentially exposed.

In the second embodiment, the stage moving speed is determined for each main field, however, in the fourth embodiment, the stage moving speed is determined for each frame. More specifically, the stage moving speed for a frame is determined based on the longest exposure periods among exposure periods for main fields constituting the frame. When the frame is exposed, the moving speed of the X-Y stage is changed to the determined moving speed, and pattern writing is performed within the frame at the same stage moving speed.

As described above, according to the second to fourth embodiments, the stage moving speed is controlled in accordance with the length of exposure period for each main field. This attains further higher throughput.

<Device Manufacturing Method>

An embodiment of a method for manufacturing a device using the above-mentioned electron beam exposure apparatus will be described.

Figure 22:
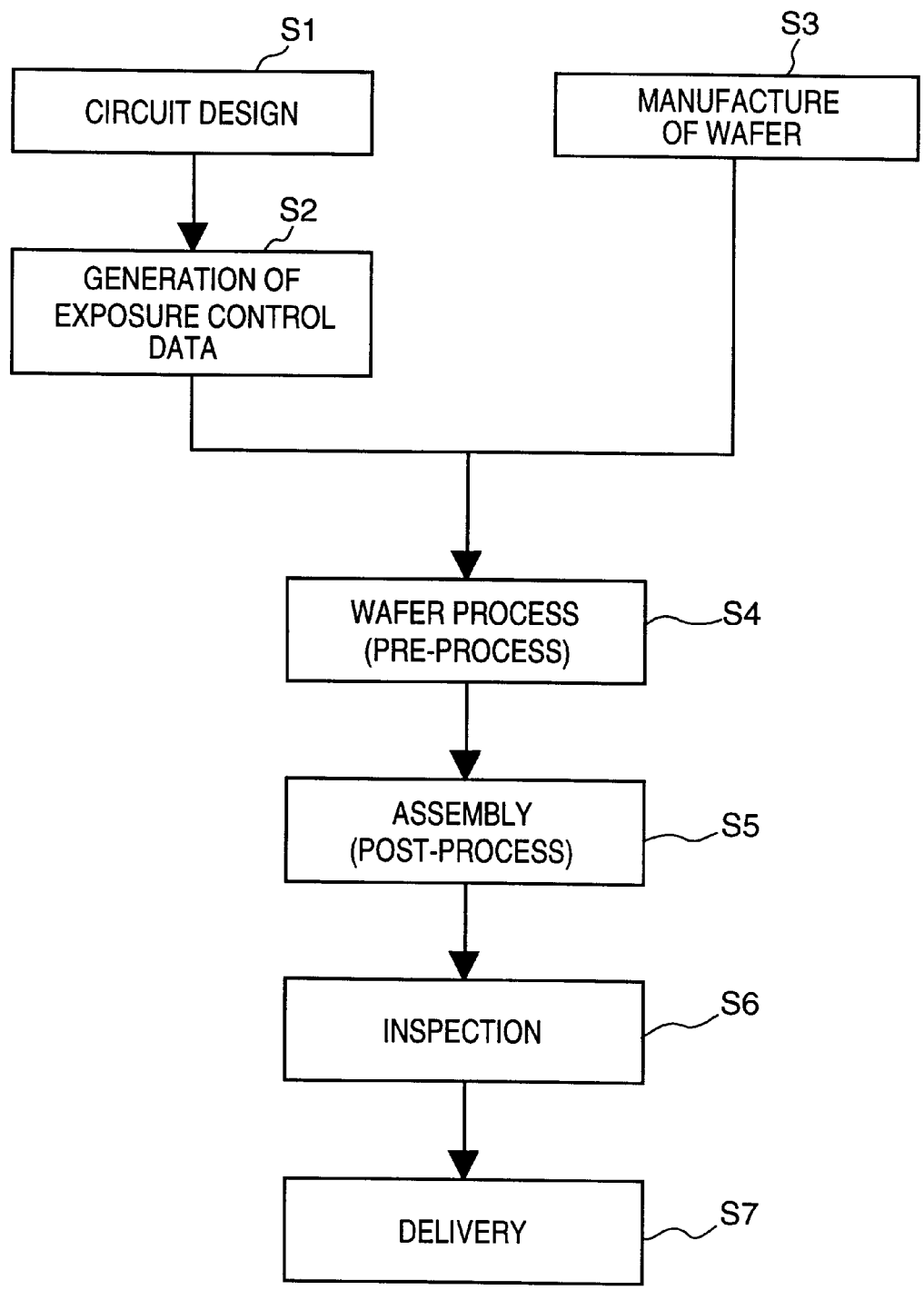
FIG. 22 is a flowchart explaining a semiconductor device manufacturing flow.

FIG. 22 shows a flow of the manufacture of a microdevice (semiconductor chip such as an IC or an LSI, a liquid crystal display panel, a CCD, a thin-film magnetic head, a micromachine, or the like). At step 1 (circuit design), the circuit design of a semiconductor device is made. At step 2 (generation of exposure control data), the exposure control data for the exposure apparatus is generated based on the designed circuit pattern. On the other hand, at step 3 (manufacture of wafer), a wafer is manufactured using materials such as silicon and the like. Step 4 (wafer process) is called a pre-process, where an actual circuit is formed on the wafer by lithography technique using the exposure apparatus with the prepared exposure control data and the manufactured wafer. The next step 5 (assembly) is called a post-process, where a semiconductor chip is assembled using the wafer formed at step 4. Step 5 includes an assembly process (dicing and bonding), a packaging process (chip encapsulating) and the like. At step 6 (inspection), inspections such as an operation test, a durability test and the like of semiconductor device assembled at step 5 are performed. The semiconductor device is completed via these processes, and is delivered (step 7).

FIG. 23 shows the detailed flow of the wafer process. At step 11 (oxidation), the surface of the wafer is oxidized. At step 12 (CVD), an insulating film is formed on the wafer surface. At step 13 (electrode formation), electrodes are formed by evaporation on the wafer. At step 14 (ion implantation), ions are implanted into the wafer. At step 15 (resist process), the wafer is coated with a photosensitive agent. At step 16 (exposure), the circuit pattern is printed on the wafer by exposure using the above-mentioned exposure apparatus. At step 17 (development), the exposed wafer is developed. At step 18 (etching), portions other than the developed resist image portions are removed by etching. At step 19 (resist stripping), the resist film which has become unnecessary after the etching is removed. By repetitively executing these steps, multiple circuit patterns are formed on the wafer.

The manufacturing method of this embodiment provides a highly integrated semiconductor device, which has not been easily manufactured by the conventional method, at low cost.

Further, the present invention can be applied to the system comprising either a plurality of units or a single unit.

Furthermore, the present invention can be applied to the case where the object of the invention can be attained by supplying programs which execute the process defined by the present system or invention.

As many apparently widely different embodiments of the present invention can be made without departing from the spirit and scope thereof, it is to be understood that the invention is not limited to the specific embodiments thereof except as defined in the claims.

What is claimed is:

1. An electron beam exposure apparatus which writes a drawing pattern based on pattern data by scanning an exposed surface by a plurality of electron beams, comprising:

drawing means for writing a pattern on a subfield, composed of a plurality of elementary exposure fields on the exposed surface, by simultaneously writing patterns on the plurality of elementary exposure fields using the plurality of electron beams;

division means for dividing said drawing pattern into pattern parts each having the same size as that of the subfield;

selection means for selecting an exposure method for each subfield based on each pattern part for the subfield obtained by said division means; and control means for controlling said drawing means to write each pattern part on each subfield by using the exposure method selected by said selection means based on said pattern data.

2. The electron-beam exposure apparatus according to claim 1, wherein said drawing means includes:

deflection means for simultaneously deflecting the plurality of electron beams; and irradiation control means for respectively turn on/off controlling irradiation of the electron beams on the exposed surface.

3. The electron-beam exposure apparatus according to claim 2, wherein said deflection means includes:

an electrostatic deflector for deflecting an electron beam in the elementary exposure field; and an electromagnetic deflector for moving the electron beams from a subfield to another subfield.

4. The electron-beam exposure apparatus according to claim 1, wherein said selection means selects a first control method to deflect the plurality of electron beams by a predetermined deflection width, set the electron beams and perform exposure, or a second control method to deflect the electron beams, set the electron beams and perform exposure at positions where at least one of the plurality of electron beams is irradiated, while not to set the electron beams at positions where no electron beams is irradiated.

5. The electron-beam exposure apparatus according to claim 4, wherein said selection means calculates exposure processing periods necessary for writing said drawing pattern in the first control method and that in the second control method, and selects one of the first and second control methods requiring shorter one of exposure processing periods.

6. The electron-beam exposure apparatus according to claim 5, wherein the exposure processing period in the first control method is calculated as a product of a setting period necessary for deflection by the predetermined deflection width and the number of irradiation positions in the subfield, while the exposure processing period in said second control method is calculated as a product of a setting period necessary for deflection by a maximum deflection width in the subfield and the number of irradiation positions in the subfield.

7. The electron-beam exposure apparatus according to claim 4, wherein said selection means selects the first control method or the second control method based on the number of irradiation positions in the subfield.

8. The electron-beam exposure apparatus according to claim 1, further comprising storing means for storing information for on/off controlling irradiation of the electron beams on the exposed surface, for each elementary exposure field, obtained based on said pattern data, and control methods for said respective subfields, selected by said selection means, into a memory.

9. An electron-beam exposure apparatus which performs exposure of an exposed surface of an exposed article on a stage by scanning the exposed surface by a plurality of electron beams, comprising:

drawing means for writing a pattern on a subfield composed of a plurality of elementary exposure fields on the exposed surface, by simultaneously writing patterns on the plurality of elementary exposure fields using the plurality of electron beams;

selection means for selecting an exposure method for each subfield based on each pattern part for the subfield;

determination means for determining a moving speed of the stage based on an exposure processing period for each subfield in use of the exposure method selected by said selection means; and control means for controlling said drawing means to write each pattern part on each subfield by using the exposure method selected by said selection means, and controlling the stage to move at the moving speed determined by said determination means.

10. The electron-beam exposure apparatus according to claim 9, wherein said drawing means includes:

deflection means for simultaneously deflecting the plurality of electron beams; and irradiation control means for respectively turn on/off controlling irradiation of the electron beams on the exposed surface.

11. The electron-beam exposure apparatus according to claim 10, wherein said deflection means includes:

an electrostatic deflector for deflecting an electron beam in the elementary exposure field; and an electromagnetic deflector for moving the electron beams from a subfield to another subfield.

12. The electron-beam exposure apparatus according to claim 9, wherein said selection means selects a first control method to deflect the plurality of electron beams by a predetermined deflection width, set the electron beams and perform exposure, or a second control method to deflect the electron beams, set the electron beams and perform exposure at positions where at least one of the plurality of electron beams is irradiated, while not to set the electron beams at positions where no electron beams is irradiated.

13. The electron-beam exposure apparatus according to claim 12, wherein said selection means calculates exposure processing periods necessary for writing said drawing pattern in the first control method and that in the second control method, and selects one of the first and second control methods requiring shorter one of exposure processing periods.

14. The electron-beam exposure apparatus according to claim 13, wherein the exposure processing period in the first control method is calculated as a product of a setting period necessary for deflection by the predetermined deflection width and the number of irradiation positions in the subfield, while the exposure processing period in said second control method is calculated as a product of a setting period necessary for deflection by a maximum deflection width in the subfield and the number of irradiation positions in the subfield.

15. The electron-beam exposure apparatus according to claim 12, wherein said selection means selects the first control method or the second control method based on the number of irradiation positions in the subfield.

16. The electron-beam exposure apparatus according to claim 9, further comprising storing means for storing information for on/off controlling irradiation of the electron beams on the exposed surface, for each elementary exposure field, obtained based on said pattern data, control methods for said respective subfields, selected by said selection means, and the moving speed of said stage determined by said determination means, into a memory.

17. The electron-beam exposure apparatus according to claim 9, wherein said determination means calculates an exposure processing period for each main field, composed of a plurality of subfields arrayed orthogonally to a moving direction of the stage, and determines the moving speed for each main field.

18. The electron-beam exposure apparatus according to claim 17, wherein said determination means corrects the moving speed such that the difference between moving speeds for adjacent main fields does not exceed a predetermined value.

19. The electron-beam exposure apparatus according to claim 9, wherein said determination means determines the moving speed in units of frames each composed of a plurality of main fields arrayed in a moving direction of the stage each composed of a plurality of subfield arrayed orthogonally to the moving direction.

20. An electron-beam exposure method for writing a drawing pattern represented by pattern data by using drawing means for writing a pattern on a subfield composed of a plurality of elementary exposure fields on an exposed surface, by simultaneously writing patterns on the plurality of elementary exposure fields by using a plurality of electron beams, comprising:

a division step of dividing said drawing pattern into pattern parts each having the same size as that of the subfield;

a selection step of selecting an exposure method for each subfield based on each pattern part for the subfield obtained at said division step; and a control step of controlling said drawing means to write each pattern part on each subfield by using the exposure method selected by at selection step based on said pattern data.

21. The electron-beam exposure method according to claim 20, wherein at said selection step, a control method is selected from a first control method to deflect the plurality of electron beams by a predetermined deflection width, set the electron beams and perform exposure, or a second control method to deflect the electron beams, set the electron beams and perform exposure at positions where at least one of the plurality of electron beams is irradiated, while not to set the electron beams at positions where no electron beams is irradiated.

22. The electron-beam exposure method according to claim 21, wherein at said selection step, exposure processing periods necessary for writing said drawing pattern in the first control method and that in the second control method are calculated, and one of the first and second control methods requiring shorter one of exposure processing periods is selected.

23. The electron-beam exposure method according to claim 22, wherein the exposure processing period in the first control method is calculated as a product of a setting period necessary for deflection by the predetermined deflection width and the number of irradiation positions in the subfield, while the exposure processing period in said second control method is calculated as a product of a setting period necessary for deflection by a maximum deflection width in the subfield and the number of irradiation positions in the subfield.

24. The electron-beam exposure method according to claim 21, wherein at said selection step, the first control method or the second control method is selected based on the number of irradiation positions in the subfield.

25. The electron-beam exposure method according to claim 20, further comprising a storing step of storing information for on/off controlling irradiation of the electron beams on the exposed surface, for each elementary exposure field, obtained based on said pattern data, and control methods for said respective subfields, selected by said selection means, into a memory.

26. An electron-beam exposure method for writing a drawing pattern represented by pattern data by using drawing means for writing a pattern on a subfield composed of a plurality of elementary exposure fields, on an exposed surface of an exposed article on a stage, by simultaneously writing patterns on the plurality of elementary exposure fields by using a plurality of electron beams, comprising:

a selection step of selecting an exposure method for each subfield based on each pattern part for the subfield;

a determination step of determining a moving speed of the stage based on an exposure processing period for each subfield in use of the exposure method selected at said selection step; and a control step of controlling said drawing means to write each pattern part on each subfield by using the exposure method selected by said selection means, and controlling the stage to move at the moving speed determined at said determination step.

27. The electron-beam exposure method according to claim 26, wherein at said selection step, a control method is selected from a first control method to deflect the plurality of electron beams by a predetermined deflection width, set the electron beams and perform exposure, or a second control method to deflect the electron beams, set the electron beams and perform exposure at positions where at least one of the plurality of electron beams is irradiated, while not to set the electron beams at positions where no electron beams is irradiated.

28. The electron-beam exposure method according to claim 27, wherein at said selection step, an exposure processing period necessary for writing said drawing pattern in the first control method and that in the second control method are calculated, and one of the first and second control methods requiring shorter one of the exposure processing periods is selected.

29. The electron-beam exposure method according to claim 28, wherein the exposure processing period in the first control method is calculated as a product of a setting period necessary for deflection by the predetermined deflection width and the number of irradiation positions in the subfield, while the exposure processing period in said second control method is calculated as a product of a setting period necessary for deflection by a maximum deflection width in the subfield and the number of irradiation positions in the subfield.

30. The electron-beam exposure method according to claim 27, wherein at said selection step, the first control method or the second control method is selected based on the number of irradiation positions in the subfield.

31. The electron-beam exposure method according to claim 26, further comprising a storing step of storing information for on/off controlling irradiation of the electron beams on the exposed surface, for each elementary exposure field, obtained based on said pattern data, control methods for said respective subfields, selected at said selection step, and the moving speed of said stage determined at said determination step, into a memory.

32. The electron-beam exposure method according to claim 26, wherein at said determination step, an exposure processing period for each main field, composed of a plurality of subfields arrayed orthogonally to a moving direction of the stage is calculated, and the moving speed is determined for each main field.

33. The electron-beam exposure method according to claim 32, wherein at said determination step, the moving speed is corrected such that the difference between moving speeds for adjacent main fields does not exceed a predetermined value.

34. The electron-beam exposure method according to claim 26, wherein at said determination step, the moving speed is determined in units of frames each composed of a plurality of main fields arrayed in a moving direction of the stage each composed of a plurality of subfield arrayed orthogonally to the moving direction.

35. An electron-beam exposure apparatus, which writes a drawing pattern on an exposed surface based on pattern data by using a plurality of electron beams, said apparatus comprising:

drawing means for writing a pattern on a subfield, composed of a plurality of elementary exposure fields on the exposed surface, by simultaneously writing patterns on the plurality of elementary exposure fields using the plurality of electron beams;

selection means for selecting a scan method for each subfield based on each pattern for the subfield; and control means for controlling said drawing means to write each pattern on each subfield by using the scan method selected by said selection means based on the pattern data.

36. The electron-beam exposure apparatus according to claim 35, wherein said drawing means comprises:

deflection means for simultaneously deflecting the plurality of electron beams; and irradiation control means for controlling irradiation of the electron beams on the exposed surface by respectively turning the irradiation on and off.

37. The electron-beam exposure apparatus according to claim 36, wherein said deflection means comprises:

an electrostatic deflector for deflecting an electron beam in the elementary exposure field; and an electromagnetic deflector for moving the electron beams from a subfield to another subfield.

38. The electron-beam exposure apparatus according to claim 35, wherein said selection means selects one of (i) a first control method to deflect the plurality of electron beams by a predetermined deflection width, to set the electron beams and to perform exposure, and (ii) a second control method to deflect the electron beams, to set the electron beams and to perform exposure at positions where at least one of the plurality of electron beams is irradiated, while not to set the electron beams at positions where none of the electron beams is irradiated.

39. The electron-beam exposure apparatus according to claim 38, wherein said selection means calculates exposure processing periods necessary for writing the drawing pattern in the first control method and for that in the second control method, and selects one of the first and second control methods, which requires a shorter one of the exposure processing periods.

40. The electron-beam exposure apparatus according to claim 39, wherein the exposure processing period in the first control method is calculated as a product of a setting period necessary for deflection by the predetermined deflection width and the number of irradiation positions in the subfield, while the exposure processing periods in the second control method is calculated as a product of a setting period necessary for deflection by a maximum deflection width in the subfield and the number of irradiation positions in the subfield.

41. The electron-beam exposure apparatus according to claim 38, wherein said selection means selects one of the first control method and the second control method based on the number of irradiation positions in the subfield.

42. The electron-beam exposure apparatus according to claim 35, further comprising storing means for storing into a memory (i) information for on/off controlling the irradiation of the electron beams on the exposed surface, for each elementary exposure field, obtained based on the pattern data, and (ii) control methods for the respective subfields, selected by said selection means.

43. A device fabrication method comprising the steps of:

coating a surface to be irradiated with a photosensitive material;

exposing the surface to be irradiated, coated with the photosensitive material, to a perdetermined pattern by using an electron-beam exposure apparatus; and developing the photosensitive material exposed to the predetermined pattern, wherein the electron-beam exposure apparatus writes a drawing pattern on an exposed surface based on pattern data by using a plurality of electron beams and performs the following steps of:

writing a pattern on a subfield, composed of a plurality of elementary exposure fields on the exposed surface, by simultaneously writing patterns on the plurality of elementary exposure fields using the plurality of electron beams;

selecting a scan method for each subfield based on each pattern for the subfield; and controlling said writing step to write each pattern on each subfield by using the scan method selected in said selecting step based on the pattern data.

* * * * *

UNITED STATES PATENT AND TRADEMARK OFFICE
CERTIFICATE OF CORRECTION

PATENT NO. : 6,104,035

DATED : August 15, 2000

INVENTOR(S) : MASATO MURAKI

Page 1 of 2

It is certified that error appears in the above-identified patent and that said Letters Patent is hereby corrected as shown below:

COLUMN 1:
   Line 37, "lowers" should read --lowering--.
   Line 44, "electronbeam" should read --electron-beam--.

COLUMN 11:
   Line 19, "show" should read --shown--.
   Line 33, "filed" should read --field--.

COLUMN 13:
   Line 54, "beams" should read --beam--.

COLUMN 15:
   Line 25, "filed" should read --field--.

COLUMN 17:
   Line 18, "subfield;" should read --subfield.--
   Line 38, "beams" should read --beam--.

COLUMN 22:
   Line 50, "is" should read --are--.

COLUMN 23:
   Line 54, "is" should read --are--.

UNITED STATES PATENT AND TRADEMARK OFFICE
CERTIFICATE OF CORRECTION

PATENT NO. : 6,104,035
DATED : August 15, 2000
INVENTOR(S) : MASATO MURAKI

It is certified that error appears in the above-identified patent and that said Letters Patent is hereby corrected as shown below:

COLUMN 24:
   Line 31, "subfield" should read --subfields--.
   Line 49, "by at" should read --at said--.
   Line 60, "is" should read --are--.

COLUMN 25:
   Line 48, "is" should read --are--.

COLUMN 26:
   Line 25, "subfield" should read --subfields--.
   Line 65, "is" should read --are--.

Signed and Sealed this

Seventeenth Day of April, 2001

Attest:

NICHOLAS P. GODICI

Attesting Officer     Acting Director of the United States Patent and Trademark Office